(12) United States Patent
Imoto et al.

(10) Patent No.: US 9,659,994 B2
(45) Date of Patent: May 23, 2017

(54) IMAGING DEVICE AND ELECTRONIC APPARATUS

(71) Applicant: Sony Corporation, Tokyo (JP)

(72) Inventors: Tsutomu Imoto, Kanagawa (JP); Keiji Mabuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/148,127

(22) Filed: May 6, 2016

(65) Prior Publication Data

US 2016/0247842 A1    Aug. 25, 2016

Related U.S. Application Data

(63) Continuation of application No. 14/567,777, filed on Dec. 11, 2014, now Pat. No. 9,373,655.

(60) Provisional application No. 61/929,842, filed on Jan. 21, 2014.

(51) Int. Cl.
*H01L 31/113* (2006.01)
*H01L 27/148* (2006.01)
*H01L 27/146* (2006.01)

(52) U.S. Cl.
CPC .... *H01L 27/14887* (2013.01); *H01L 27/1463* (2013.01); *H01L 27/14609* (2013.01); *H01L 27/14612* (2013.01); *H01L 27/14627* (2013.01); *H01L 27/14636* (2013.01); *H01L 27/14643* (2013.01); *H01L 27/14654* (2013.01); *H01L 27/14689* (2013.01); *H01L 27/14812* (2013.01)

(58) Field of Classification Search
CPC ......... H01L 27/14887; H01L 27/14689; H01L 27/1463; H01L 27/14643
USPC ....................................... 257/230
See application file for complete search history.

(56) References Cited

U.S. PATENT DOCUMENTS 7,709,870 B2 *  5/2010  Inoue ............... H01L 27/14609
                                                                257/231

* cited by examiner

*Primary Examiner* — Marc Armand
*Assistant Examiner* — Tifney Skyles
(74) *Attorney, Agent, or Firm* — Sheridan Ross P.C.

(57) ABSTRACT

An imaging device includes: a photoelectric conversion region that generates photovoltaic power for each pixel depending on irradiation light; and a first element isolation region that is provided between adjacent photoelectric conversion regions in a state of surrounding the photoelectric conversion region.

8 Claims, 28 Drawing Sheets

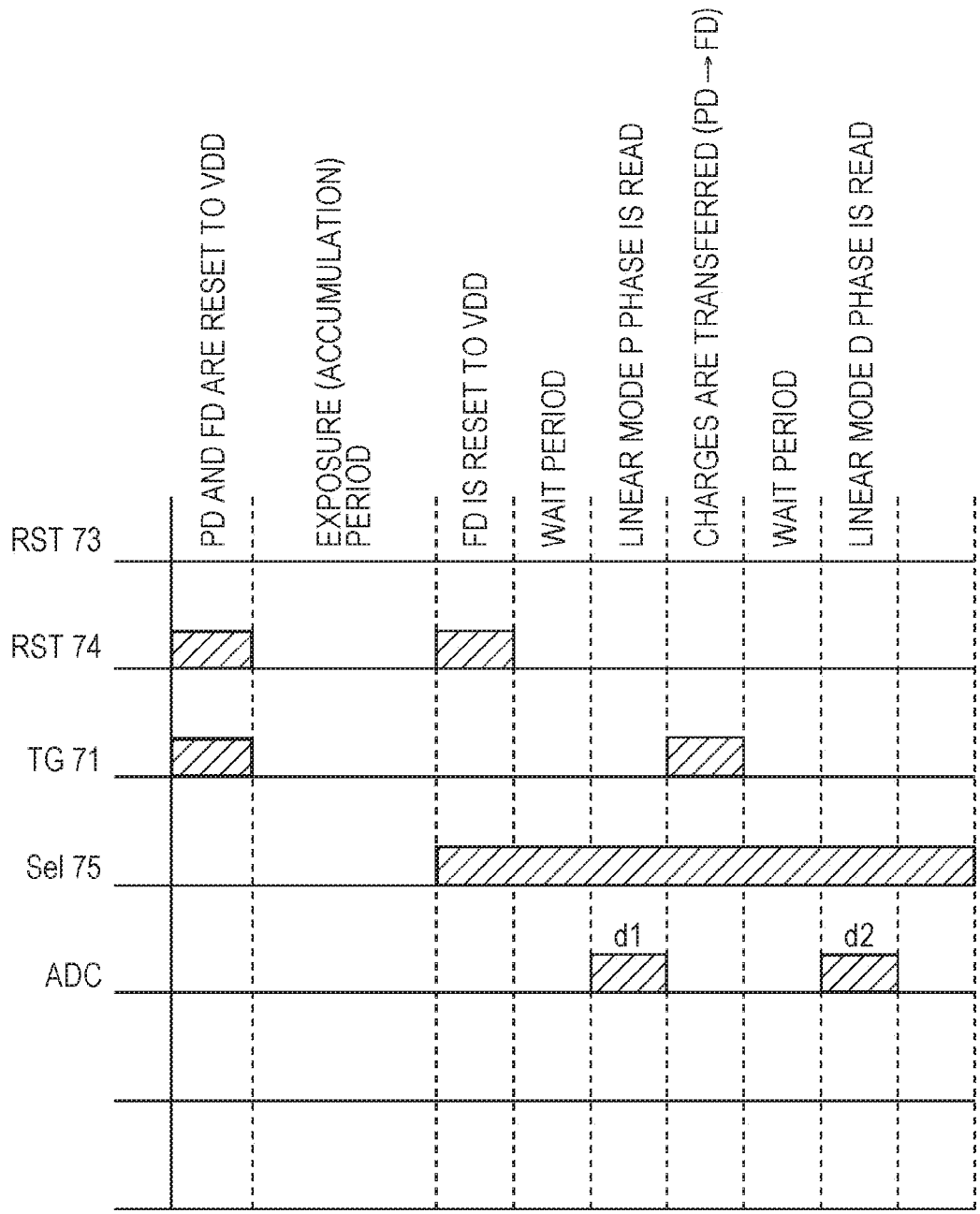

IMAGING DEVICE AND ELECTRONIC APPARATUS

CROSS-REFERENCE TO RELATED APPLICATION

This application is a continuation of U.S. patent application Ser. No. 14/567,777, filed Dec. 11, 2014, which claims the benefit of priority of U.S. Provisional Application Ser. No. 61/929,842, filed Jan. 21, 2014, the entire contents of each of which are incorporated herein by reference.

BACKGROUND

The present disclosure relates to an imaging device and an electronic apparatus, and specifically, to an imaging device and an electronic apparatus that can solve a problem such as blooming due to a PN junction diode.

In the related art, a charge accumulation type imaging device (hereinafter, referred to as an accumulation type imaging device) as an imaging device equipped in an electronic apparatus having an imaging function represented by a digital camera is known.

In the accumulation type imaging device, when excessive light is incident and an accumulation charge amount exceeds a saturation charge amount, an excess portion of a signal charge flows into an N-type substrate beyond an overflow barrier or flows into floating diffusion beyond a potential barrier under a transfer gate. Therefore, since a dynamic range of the accumulation type imaging device is limited by the saturation charge amount of a charge accumulation region, it is difficult to realize a large dynamic range and, as a result, there is a problem that overexposure or underexposure is likely to occur.

Thus, as a solid-state imaging device capable of solving such a problem, a logarithmic sensor configured of photovoltaic type pixels is proposed (for example, see EP1354360 and US2011/0025898A1).

FIG. 1 illustrates an equivalent circuit for one pixel of the photovoltaic type pixel configuring the logarithmic sensor (EP1354360, FIG. 5).

In a photovoltaic type pixel 1, photovoltaic power proportional to a logarithm of a photocurrent value depending on incident light 2 is generated by a PN junction diode 3, the photovoltaic power that is generated is amplified by an amplifier 4 and becomes an image signal, and the image signal that is generated is output to a vertical signal line 7 through a switch 6. Moreover, the PN junction diode 3 is reset by a switch 5.

As described above, in the photovoltaic type pixel 1, since the image signal that is generated is output to a subsequent stage without being accumulated, even when excessive incident light 2 is incident, the pixel signal is not saturated.

Moreover, the photovoltaic type pixel 1 can be operated as an accumulation type.

SUMMARY

However, as a result of analysis of the photovoltaic type pixel 1, the following disadvantages are found.

A first disadvantage is the blooming. FIG. 2 is a cross-sectional view illustrating an example of a pixel structure of the photovoltaic type pixel illustrated in FIG. 1 and illustrates an overview of the occurrence of the blooming.

Specifically, when the photovoltaic power is generated corresponding to the incident light 2, the PN junction diode that is a photo-sensor is biased in a forward direction and, as a result, since electrons diffuse from an N-type region into a P-type substrate, as represented by a dot line A of FIG. 2, the electrons which are diffused may reach the adjacent photo-sensor (PN junction diode). In this case, since the adjacent pixel is also the photovoltaic type pixel, the blooming occurs. Moreover, although not illustrated, even if the adjacent pixel of the photovoltaic type pixel 1 is the accumulation type pixel, the blooming occurs similarly.

A second disadvantage is that temperature change of the pixel signal amount is large. A pixel signal voltage $V_{PD}$ can be represented by the following Expression (1).

$$V_{PD} = -\frac{kT}{q}\ln\left(\frac{I_\lambda}{I_S}+1\right) \quad (1)$$

Here, $I_\lambda$ is the photocurrent, $I_s$ is a reverse saturated current in the PN junction diode 3 and is a value that exponentially increases with the increase of the temperature. Thus, when $I_s$ exponentially increases with the increase of the temperature, the pixel signal voltage $V_{PD}$ is remarkably decreased.

The description will be explained in more detail. FIG. 3 illustrates a relationship between illuminance (standardized) of the incident light at each temperature of the photovoltaic type pixel 1 illustrated in FIG. 1 and an output voltage of the PN junction diode 3. It is understood from FIG. 3 that the generated voltage remarkably decreases even in the same illuminance when the temperature is decreased.

A third disadvantage is that low illuminance sensitivity is low and variation suppression is difficult. As represented in Expression (1), in order to increase the sensitivity, it is necessary to lower the $I_s$. However, it is known that the $I_s$ is increased by impurity contamination or crystal defects and it is necessary to suppress those. However, it becomes costly to suppress all these because it takes a high degree of process control.

A fourth disadvantage is that when a photovoltaic type pixel 1 operates as the accumulation type, the dark current is increased.

FIG. 4 illustrates a relationship between irradiation time of the photovoltaic type pixel 1 and the output voltage (US2011/0025898A1, FIG. 2).

A case where the operation is performed as the accumulation type corresponds to a Linear region of the same view and the occurrence of the dark current can be confirmed.

Description will be given in detail. FIG. 5 is an enlarged view when a reverse bias is applied in the vicinity of the photo-sensor (the PN junction diode 3) of the photovoltaic type pixel 1 illustrated in FIG. 1. When the photovoltaic type pixel 1 is operated as the accumulation type, the photo-sensor is reverse biased and, in this case, since a depletion layer spreads as illustrated in the same view and then Si/SiO$_2$ interface is positioned in the depletion layer, the dark current is increased due to influence of the interface state.

In the present disclosure, it is desirable to realize an imaging device that is excellent in low illuminance sensitivity and low illuminance S/N and of which sensitivity is less sensitive to a temperature while realizing a wide dynamic range.

According to a first embodiment of the present disclosure, there is provided an imaging device including: a photoelectric conversion region that generates photovoltaic power for each pixel depending on irradiation light; and a first element isolation region that is provided between adjacent photoelectric conversion regions in a state of surrounding the photoelectric conversion region.

The imaging device according to the first embodiment of the present disclosure may further include a second element isolation region that is provided between the photoelectric conversion region and a pixel circuit region.

The first and second element isolation regions may be configured of a material that blocks a diffusion current.

A PN junction diode may be formed in the photoelectric conversion region as a photo-sensor.

A transfer gate and floating diffusion may be further formed in the photoelectric conversion region.

A photovoltaic type pixel and an accumulation type pixel may be formed in the adjacent photoelectric conversion regions.

In the first embodiment of the present disclosure, the photovoltaic power is generated for each pixel depending on the irradiation light and the diffusion current is blocked by the first element isolation region provided between the adjacent photoelectric conversion regions in a state of surrounding the photoelectric conversion region.

According to a second embodiment of the present disclosure, there is provided an electronic apparatus equipped with an imaging device, in which the imaging device includes: a photoelectric conversion region that generates photovoltaic power for each pixel depending on irradiation light; and a first element isolation region that is provided between adjacent photoelectric conversion regions in a state of surrounding the photoelectric conversion region.

In the second embodiment of the present disclosure, with the imaging device of the electronic apparatus, the photovoltaic power is generated for each pixel depending on the irradiation light and the diffusion current is blocked by the first element isolation region provided between the adjacent photoelectric conversion regions in a state of surrounding the photoelectric conversion region.

According to the first embodiment of the present disclosure, it is possible to suppress the blooming between the pixels.

According to the second embodiment of the present disclosure, it is possible to obtain an image with excellent sensitivity and S/N in low illuminance.

BRIEF DESCRIPTION OF THE DRAWINGS

FIG. 21 is a timing chart when the accumulation type and photovoltaic type pixel of FIG. 17 is operated as an accumulation type pixel;

DETAILED DESCRIPTION OF EMBODIMENTS

Figure 1:
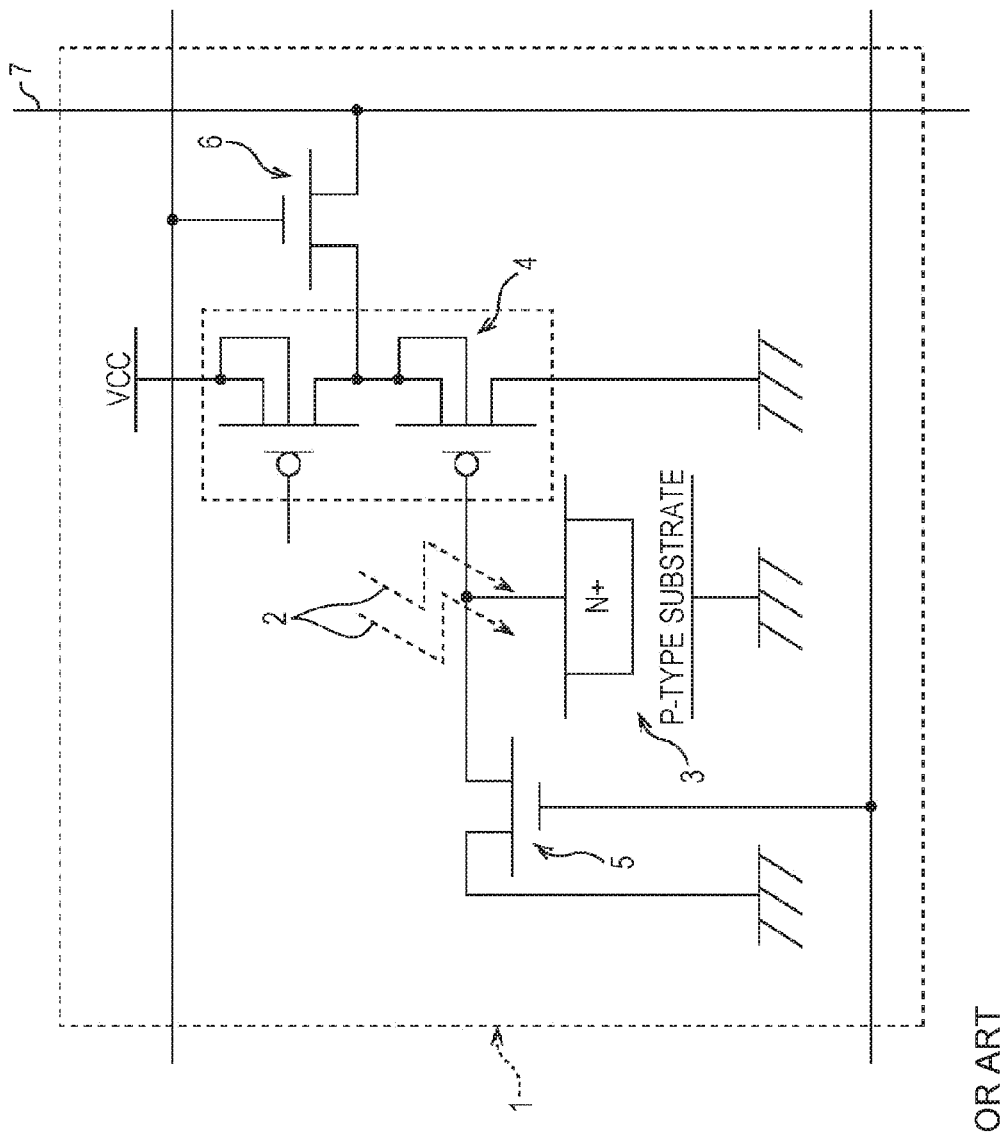
FIG. 1 is a circuit diagram illustrating an equivalent circuit for one pixel of a photovoltaic type pixel configuring a logarithmic sensor.
Figure 2:
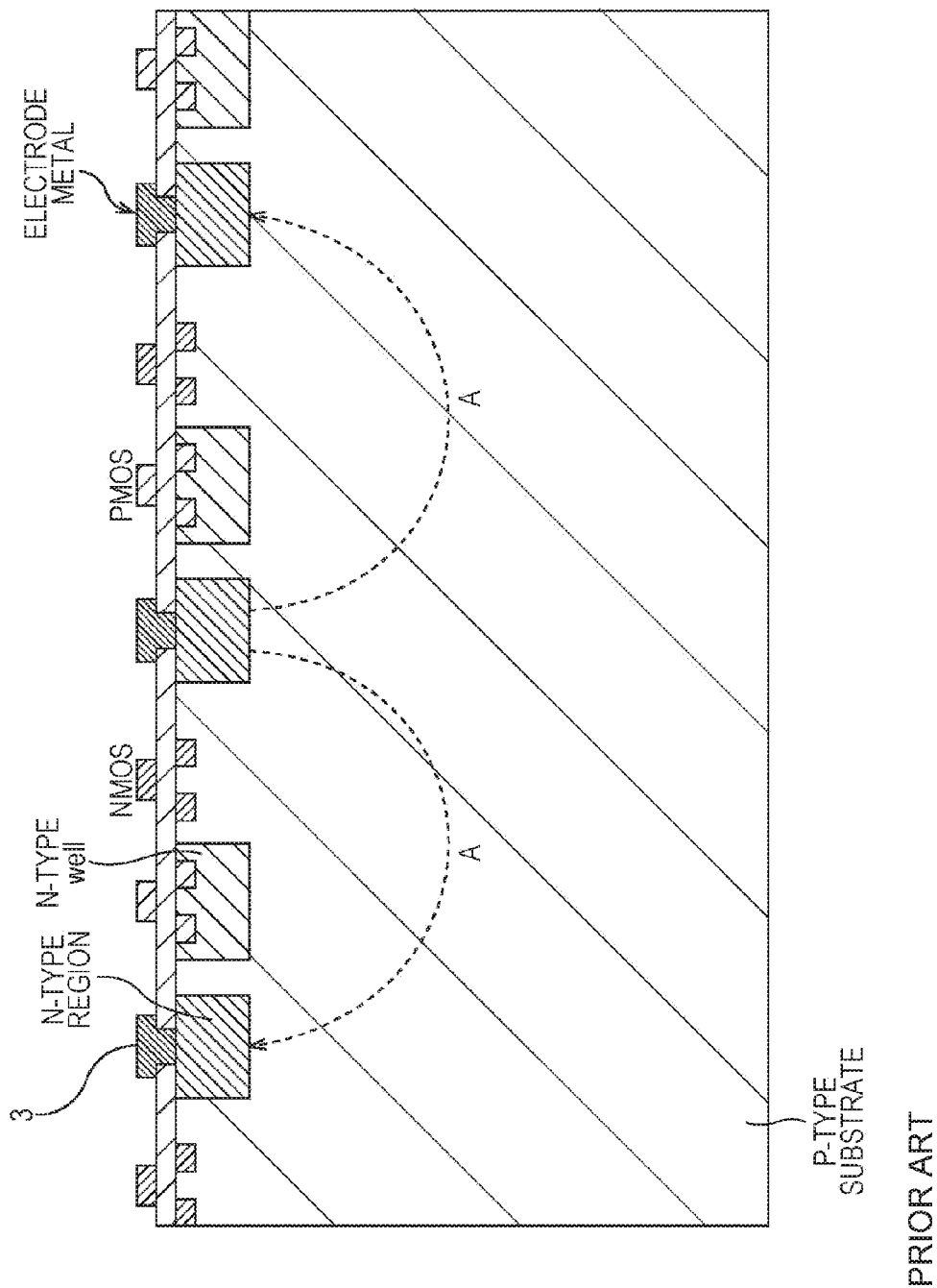
FIG. 2 is a cross-sectional view of a pixel structure corresponding to the equivalent circuit of FIG. 1.
Figure 3:
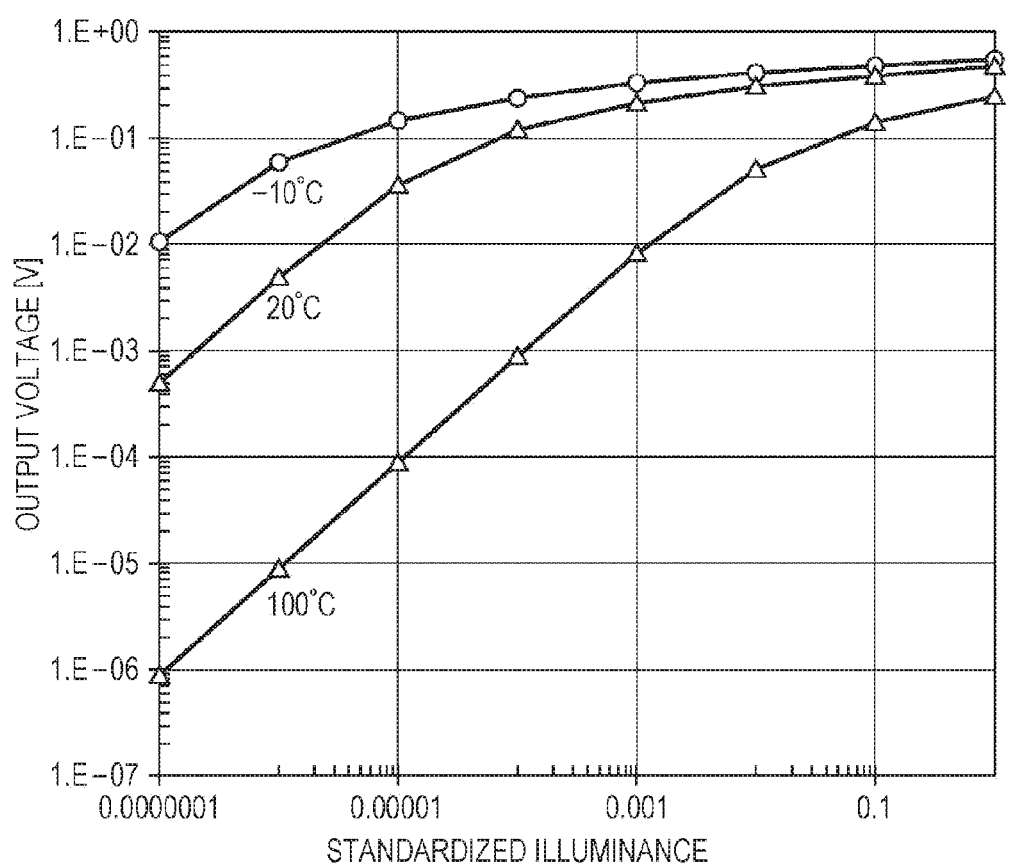
FIG. 3 is a view illustrating a voltage generated at each temperature for the same illuminance.
Figure 4:
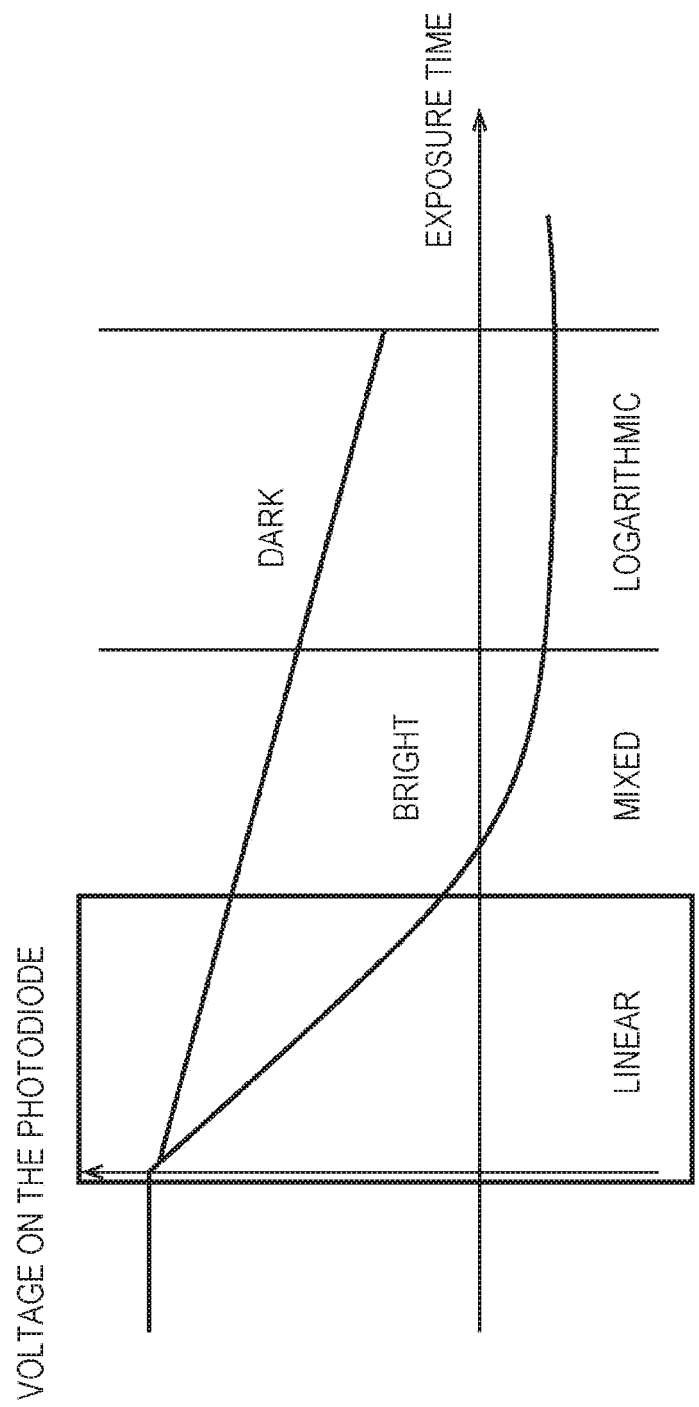
FIG. 4 is a view illustrating a relationship between irradiation time of a photovoltaic type pixel and an output voltage.
Figure 5:
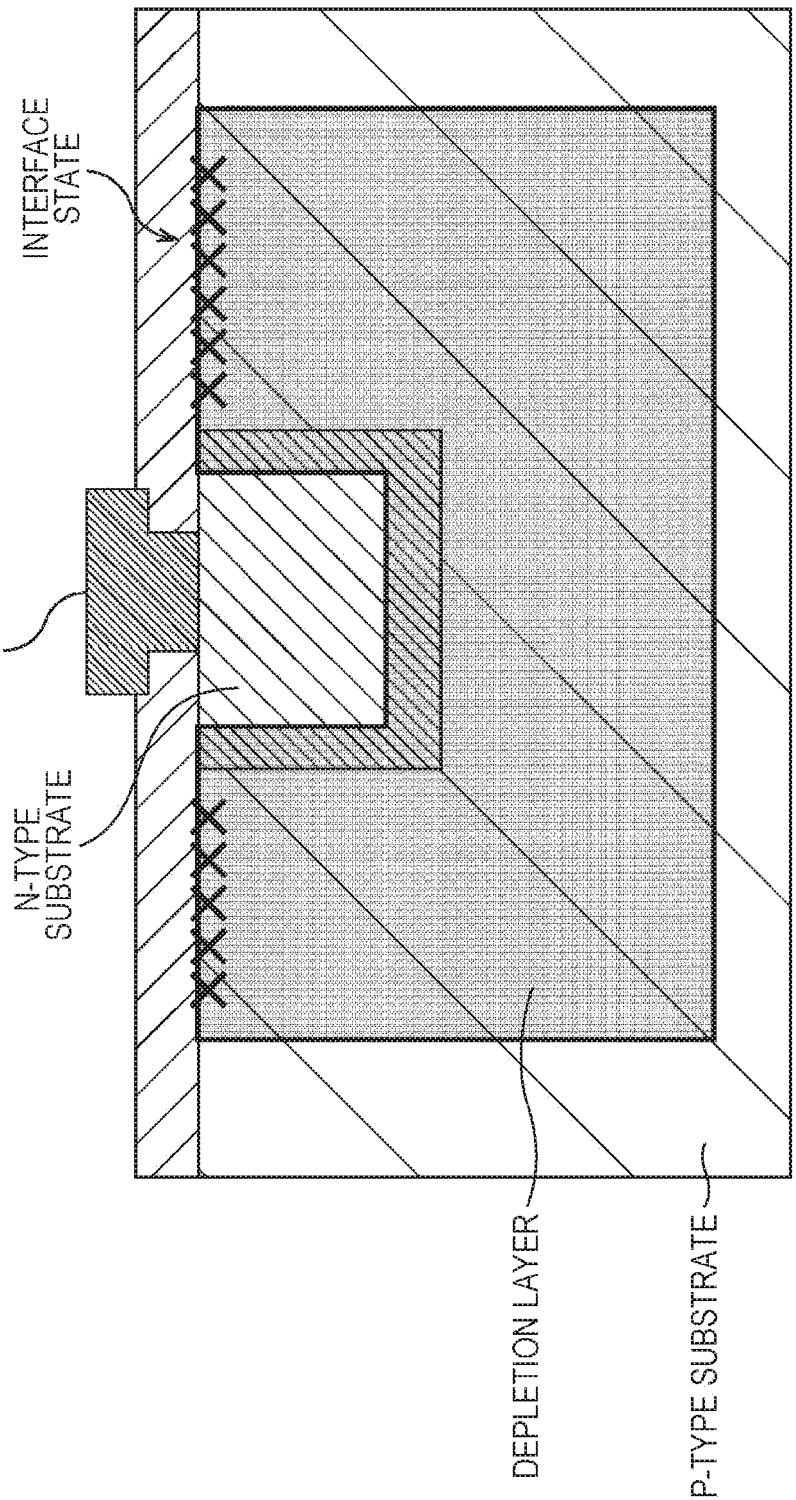
FIG. 5 is a view illustrating spread of a depletion layer generated in a photo-sensor in a reverse bias.

Hereinafter, a best mode (hereinafter, referred to as an embodiment) for implementing the present disclosure is described in detail with reference to the drawings. Moreover, the description is performed in the following order.
1. First Embodiment
2. Second Embodiment 1. First Embodiment A photovoltaic type pixel according to a first embodiment will be described with reference to the drawings. Moreover, the same reference numerals are appropriately given to common portions in each view.

Figure 6:
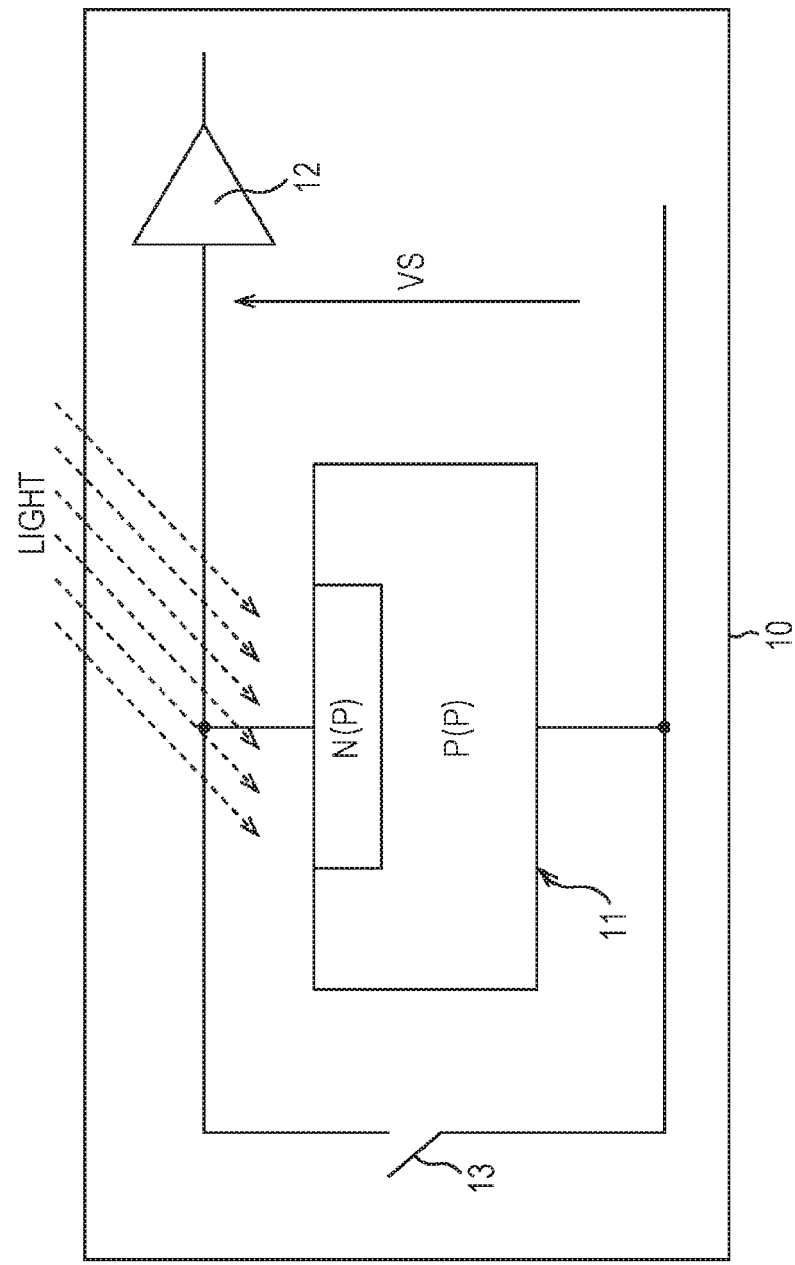
FIG. 6 is a circuit diagram illustrating an equivalent circuit of a photovoltaic type pixel that is a first embodiment of the present disclosure.

FIG. 6 illustrates an equivalent circuit of a photovoltaic type pixel according to the first embodiment. A photovoltaic type pixel 10 has a PN junction diode 11, an amplifier 12 and a switch 13. The PN junction diode 11 generates photovoltaic power in proportion to a logarithm of a photocurrent value depending on incident light. The amplifier 12 amplifies the generated photovoltaic power and outputs a pixel signal obtained as a result thereof to a subsequent stage. The switch 13 resets the PN junction diode 11.

Figure 7:
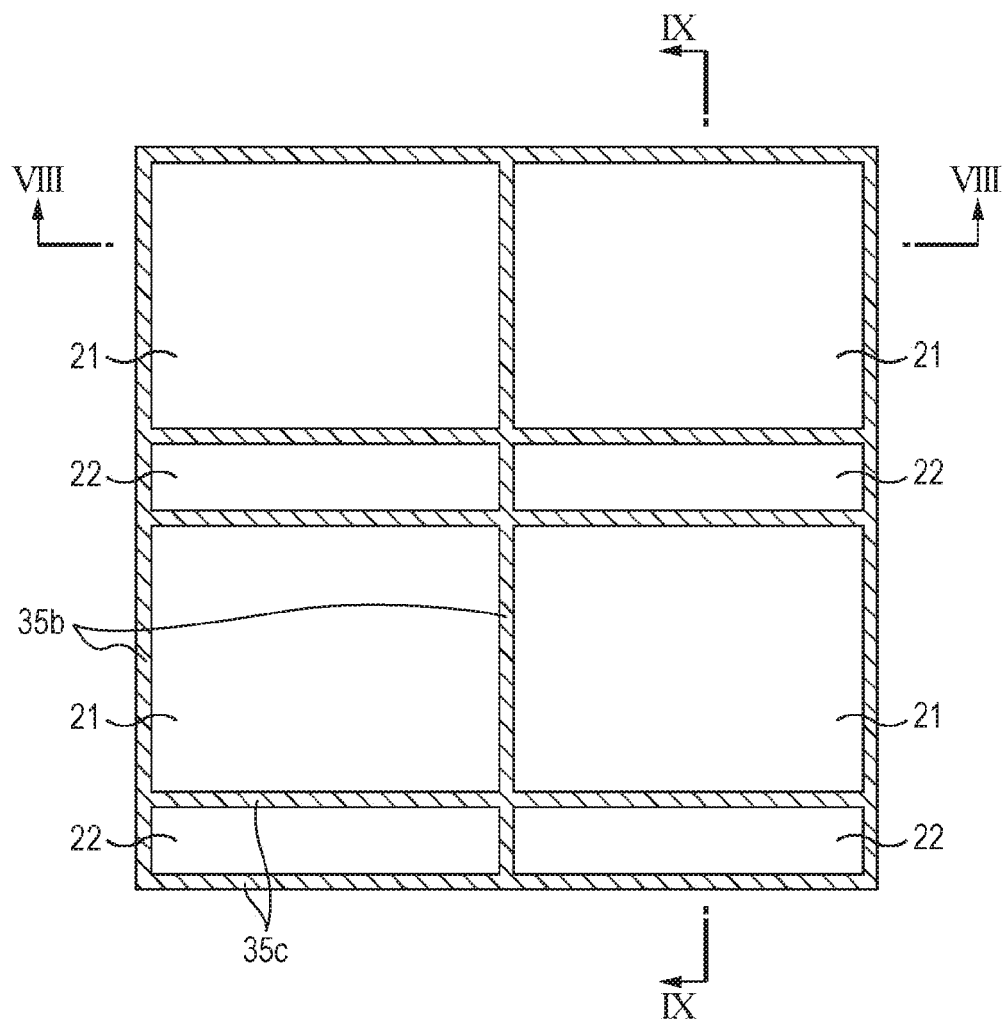
FIG. 7 is a top view of a pixel structure corresponding to the photovoltaic type pixel of FIG. 6.

FIG. 7 illustrates an arrangement view of an upper surface for 2×2 pixels of a pixel structure corresponding to the photovoltaic type pixel 10 of which the equivalent circuit is illustrated in FIG. 6. As illustrated in the same view, the photovoltaic type pixel 10 is configured of a photoelectric conversion region 21 and a pixel circuit region 22 which are isolated by an element isolation region 35. The PN junction diode 11 of FIG. 6 is formed in the photoelectric conversion region 21 and an amplifier 4, a switch 5, a MOS Tr. 36 (FIG. 11), and the like besides the PN junction diode 11 are formed in the pixel circuit region 22.

Figure 8:
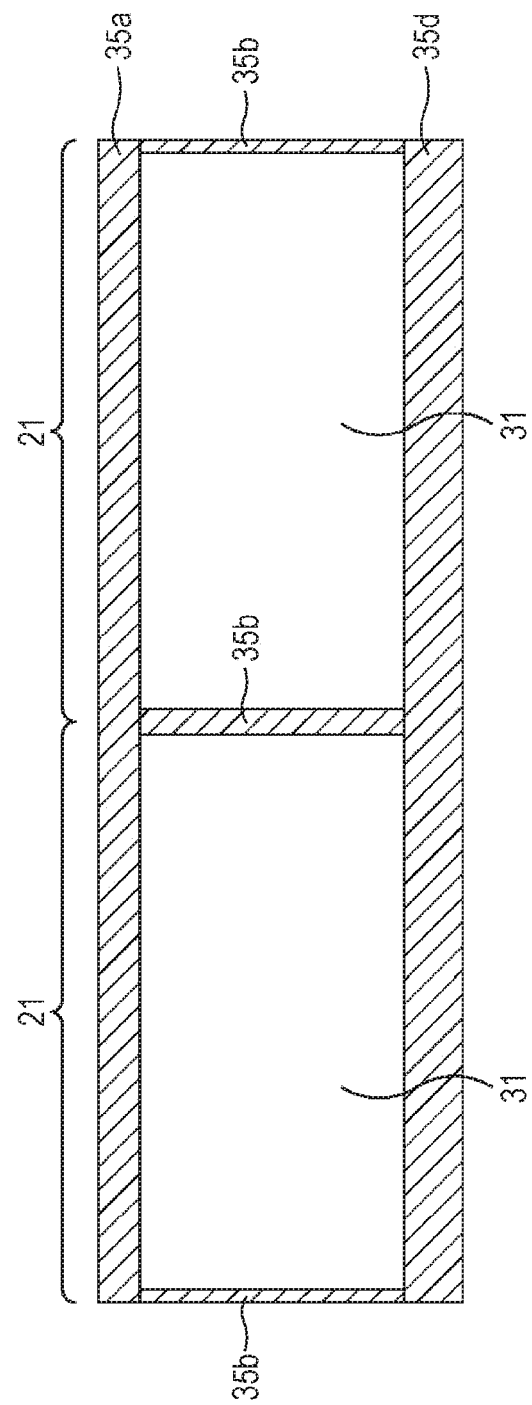
FIG. 8 is a cross-sectional view of a pixel structure corresponding to the photovoltaic type pixel of FIG. 6.
Figure 9:
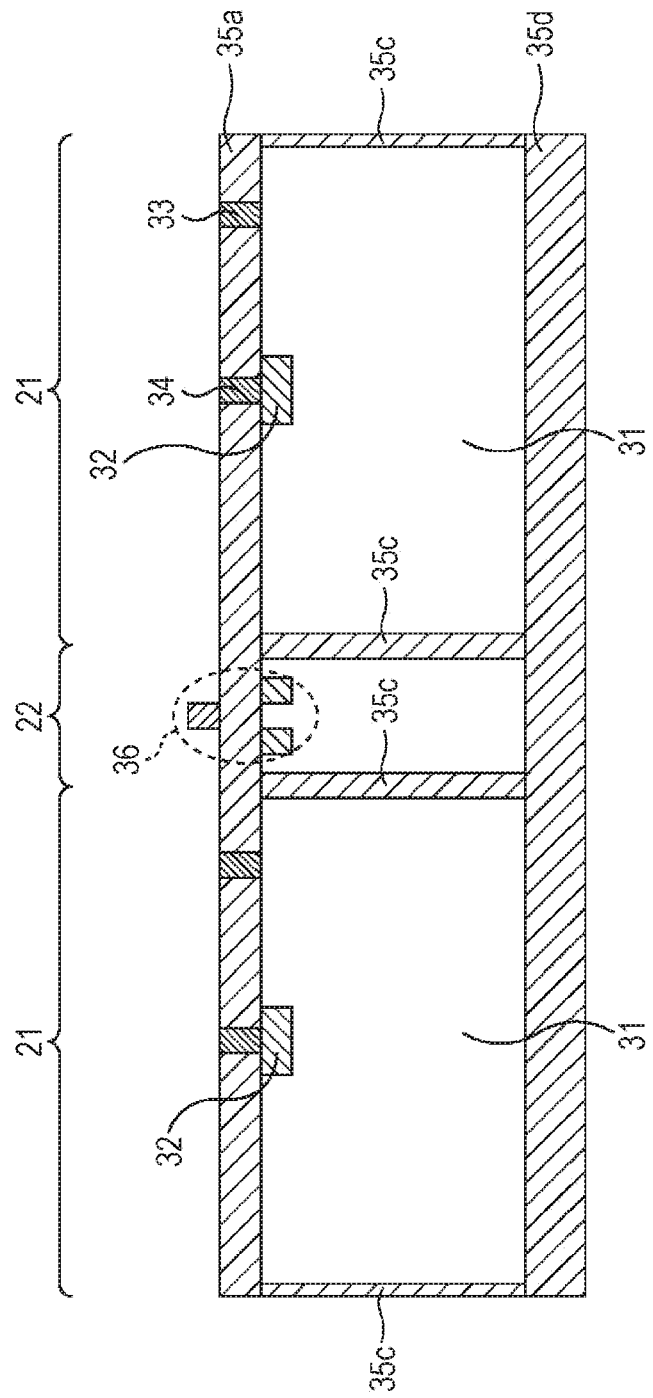
FIG. 9 is a cross-sectional view of a pixel structure corresponding to the photovoltaic type pixel of FIG. 6.

FIG. 8 illustrates a cross section of the pixel structure in line VIII-VIII of FIG. 7 and FIG. 9 illustrates a cross section of the pixel structure in line IX-IX of FIG. 7. As is apparent from the cross sections of FIGS. 8 and 9, isolation between the photoelectric conversion region 21 and the photoelectric conversion region 21, and between the photoelectric conversion region 21 and the pixel circuit region 22 is performed by the element isolation region 35.

Specifically, as illustrated in FIG. 9, the PN junction diode 11 formed in the photoelectric conversion region 21 is configured of a P-type region 31, an N-type region 32, an electrode 33 for ohmic contact with the P-type region 31, and an electrode 34 for ohmic contact with the N-type region 32.

For example, the P-type region 31 is a semiconductor of IV groups such as Si and Ge into which acceptor impurities are introduced, a semiconductor of III-V groups such as GaAs, InP, and InGaAs, or a semiconductor of II-VI groups selected from Hg, Cd, Te, Zn, and the like.

For example, the N-type region 32 is a semiconductor of IV groups such as Si and Ge into which donor impurities are introduced, a semiconductor of III-V groups such as GaAs, InP, and InGaAs, or a semiconductor of II-VI groups selected from Hg, Cd, Te, Zn, and the like.

The electrodes 33 and 34 are selected depending on a material of the P-type region 31 or the N-type region 32 with which each of the electrodes 33 and 34 comes into contact. For example, if the P-type region 31 and the N-type region 32 are Si, for example, an Al, Ti/W laminated film and the like are selected as the electrodes 33 and 34.

The element isolation region 35 is provided to suppress a leakage current between the photoelectric conversion regions 21 (the PN junction diodes 11) which are adjacent to each other, and the photoelectric conversion region 21 and the pixel circuit region 22 which are adjacent to each other. Thus, the element isolation region 35 is disposed so as to surround a circumference of the photoelectric conversion region 21 (the PN junction diode 11).

Moreover, at least one of element isolation regions 35a and 35d disposed above and below the P-type region 31 has optical transparency in order to cause the incident light to reach the PN junction diode 11.

The element isolation region 35 is configured of one of the following materials or a combination thereof.

Insulating film ($SiO_2$, SiN, BSG, PSG, SiON, and the like)

Conductive semiconductor (for example, if the PN junction diode 11 is Si, n-Si and the like of a reverse conductive type with the P-type region 31)

Metal (an ohmic electrode and a Schottky electrode for the P-type region 31)

Moreover, the conductive semiconductor as the element isolation region 35 may be the same material as the P-type region 31 or the N-type region 32 of the PN junction diode 11, and is configured of a different type of semiconductor material and then may form a heterojunction. Otherwise, the same potential as the P-type region 31 of the PN junction diode 11 is applied to the conductive semiconductor and the metal as the element isolation region 35, and a thermal equilibrium state is formed between the element isolation region 35 and the P-type region 31 of the PN junction diode 11.

As described above, since electrons diffused from the N-type region 32 to the P-type region 31 are prevented from reaching the adjacent pixel by providing the element isolation region 35, it is possible to suppress the blooming to the adjacent pixel.

Figure 10:
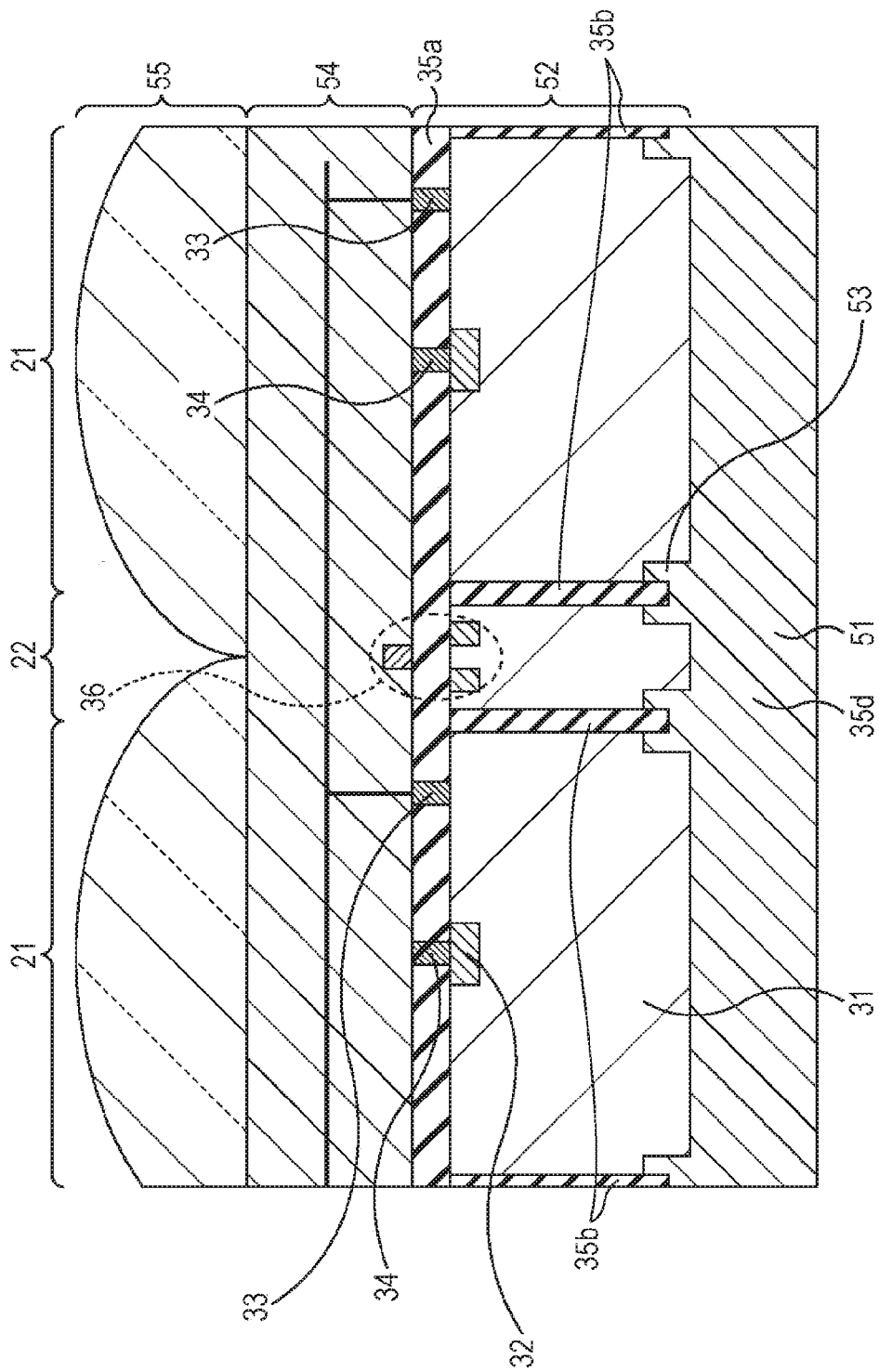
FIG. 10 is a cross-sectional view illustrating a first configuration example when the photovoltaic type pixel of FIG. 6 is applied to a surface irradiation type imaging device.

Specific Configuration Example of Photovoltaic Type Pixel 10 of First Embodiment FIG. 10 is a cross-sectional view of a configuration example (hereinafter, referred to as a first configuration example) in a case where the photovoltaic type pixel 10 of the first embodiment is applied to a surface irradiation type imaging device.

The first configuration example is configured by laminating an epitaxial growth layer (epitaxial layer) 52, a wiring layer 54, and a condensing layer 55 on an N-type substrate 51 in this order.

In the first configuration example, $SiO_2$ is used in the element isolation region 35a covering the upper side of the N-type region 32 and a combination of $SiO_2$ and the conductive semiconductor (n-Si) is used in the element isolation regions 35b and 35c, and the N-type substrate 51 of the conductive semiconductor functions as the element isolation region 35d covering the lower side of the N-type region 32.

A manufacturing method of the first configuration example of FIG. 10 will be described. First, the N-type epitaxial growth layer 52 of low concentration is laminated on the N-type substrate 51 by the existing method. Next, N-type impurity (for example, phosphorus or arsenic) and P-type impurity (for example, boron) are ion-implanted in the epitaxial growth layer 52, and activation annealing is performed by the existing method and then the P-type region and the N-type region (not illustrated) of high concentration are formed respectively in forming regions of an N-type region 53, the P-type region 31, the N-type region 32, and the electrodes 33 and 34.

Next, an active element such as the MOS Tr. 36 and a passive element such as MOS capacitance and diffusion layer resistance are formed in the pixel circuit region 22.

Subsequently, the region forming the element isolation regions 35b and 35c of the epitaxial growth layer 52 is etched and SiO$_2$ is embedded therein, and the element isolation regions 35b and 35c are formed. For the etching, it is possible to use reactive ion etching, a method of anodic oxidation, and the like. Furthermore, for the embedding of SiO$_2$, it is possible to use an ALD method, a CVD method, or a combination of CMP technology after thermally oxidizing Si of the etching surface.

Next, the Si surface of the epitaxial growth layer 52 is thermally oxidized, the element isolation region 35a is formed and an oxide film on the P-type region 31 and the N-type region 32 is removed by etching, and metal is embedded therein, and then the electrodes 33 and 34 are formed. For the metal that is embedded as the electrodes 33 and 34, for example, it is possible to use Al, the Ti/W laminated film, and the like.

Thereafter, the wiring layer 54 is formed by the existing method and, finally, the condensing layer 55 including an on-chip lens is formed by the existing method.

Moreover, in FIG. 10, distribution of impurities within each of the P-type region 31 and the N-type region 32 is not illustrated, but in order to increase the sensitivity, a width of the depletion layer formed between both sides is widened, the impurity concentration of a boundary region of both sides is decreased and then effective p-i-n junction may be formed. In this case, an i layer may be a weak N-type layer or a weak P-type layer. However, in the configuration example of FIG. 10, the N-type region 32 is illustrated so as to be narrower than the P-type region 31, but when the weak N-type layer is provided, the N-type region 32 is formed so as to be wider than the P-type region 31.

Figure 11:
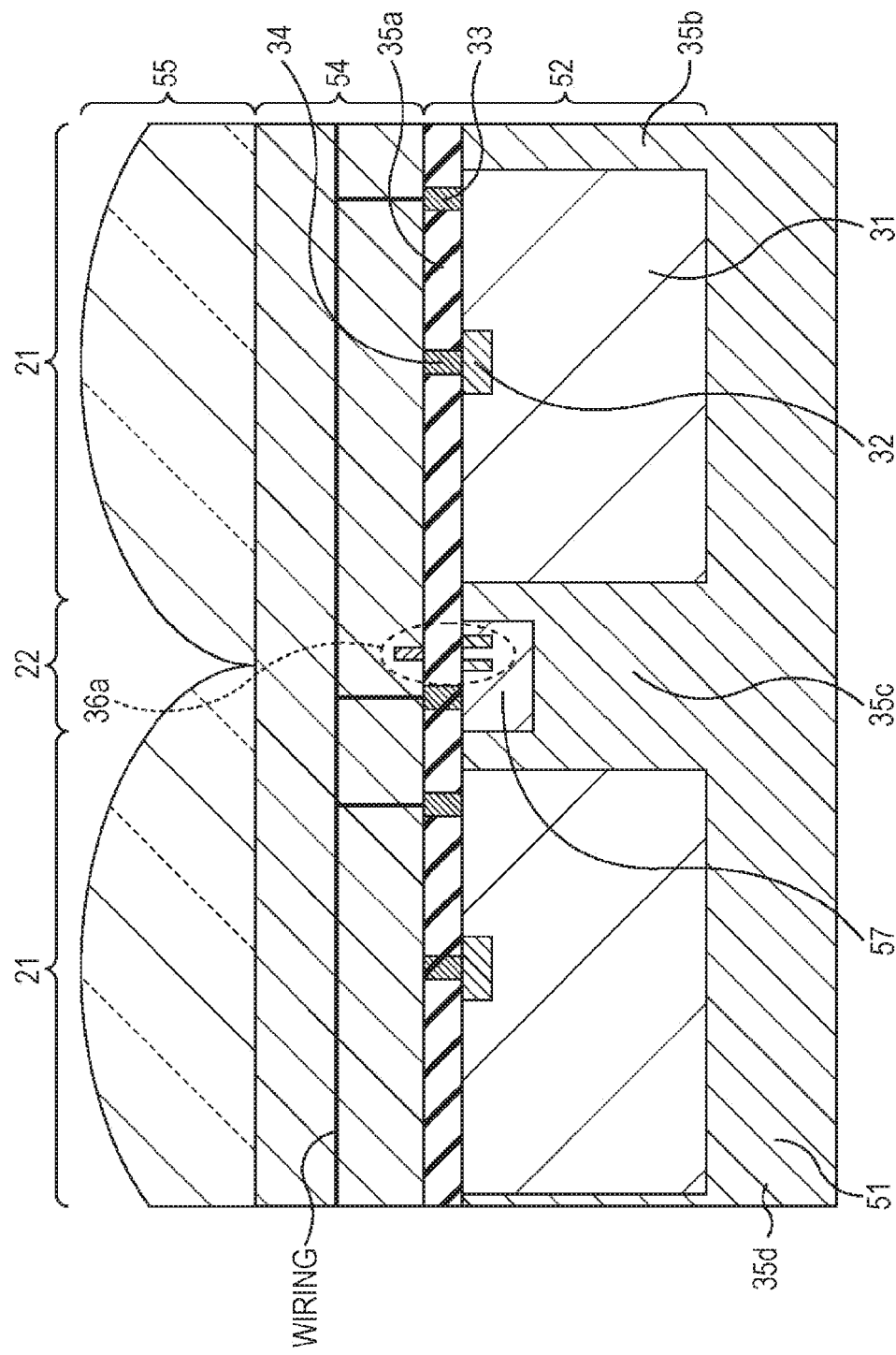
FIG. 11 is a cross-sectional view illustrating a second configuration example when the photovoltaic type pixel of FIG. 6 is applied to a surface irradiation type imaging device.

Next, FIG. 11 is a cross-sectional view of another configuration example (hereinafter, referred to as a second configuration example) in which the photovoltaic type pixel 10 of the first embodiment is applied to the surface irradiation type imaging device.

In the second configuration example, SiO$_2$ is used in the element isolation region 35a covering the upper side of the N-type region 32 and the conductive semiconductor (n-Si) is used in the element isolation regions 35b and 35c, and the N-type substrate 51 of the conductive semiconductor (n-Si) functions as the element isolation region 35d covering the lower side of the N-type region 32.

An NMOS Tr. 36a of the pixel circuit region 22 is formed in a p-well 57 formed in the element isolation region 35a.

In the second configuration example, since the N-type substrate 51 and the element isolation regions 35b and 35c act as a drain of a diffusion current from the N-type region 32 to the P-type region 31, and the diffusion current is inhibited from flowing to the adjacent photoelectric conversion region 21, it is possible to suppress the blooming.

A manufacturing method of the second configuration example of FIG. 11 will be described. First, the N-type epitaxial growth layer 52 of low concentration is laminated on the N-type substrate 51 by the existing method. Next, the N-type impurity (for example, phosphorus or arsenic) and the P-type impurity (for example, boron) are ion-implanted in the epitaxial growth layer 52, and activation annealing is performed by the existing method and then the P-type region and the N-type region (not illustrated) of high concentration are formed respectively in forming regions of the P-type region 31, the N-type region 32, the element isolation regions 35c and 35b, and the electrodes 33 and 34.

Next, the p-well 57 is formed in the element isolation region 35c of the pixel circuit region 22 and the NMOS Tr. 36a is formed in the p-well 57. Although not illustrated, when pMOS Tr. is formed, an n-well is formed inside the p-well 57 and the pMOS Tr. is formed therein.

Next, the Si surface of the epitaxial growth layer 52 is thermally oxidized, the element isolation region 35a is formed and an oxide film on the P-type region 31 and the N-type region 32 is removed by etching, and metal is embedded therein, and then the electrodes 33 and 34 are formed. For the metal that is embedded as the electrodes 33 and 34, for example, it is possible to use Al, the Ti/W laminated film, and the like.

Thereafter, the wiring layer 54 is formed by the existing method and, finally, the condensing layer 55 including the on-chip lens is formed by the existing method.

Figure 12:
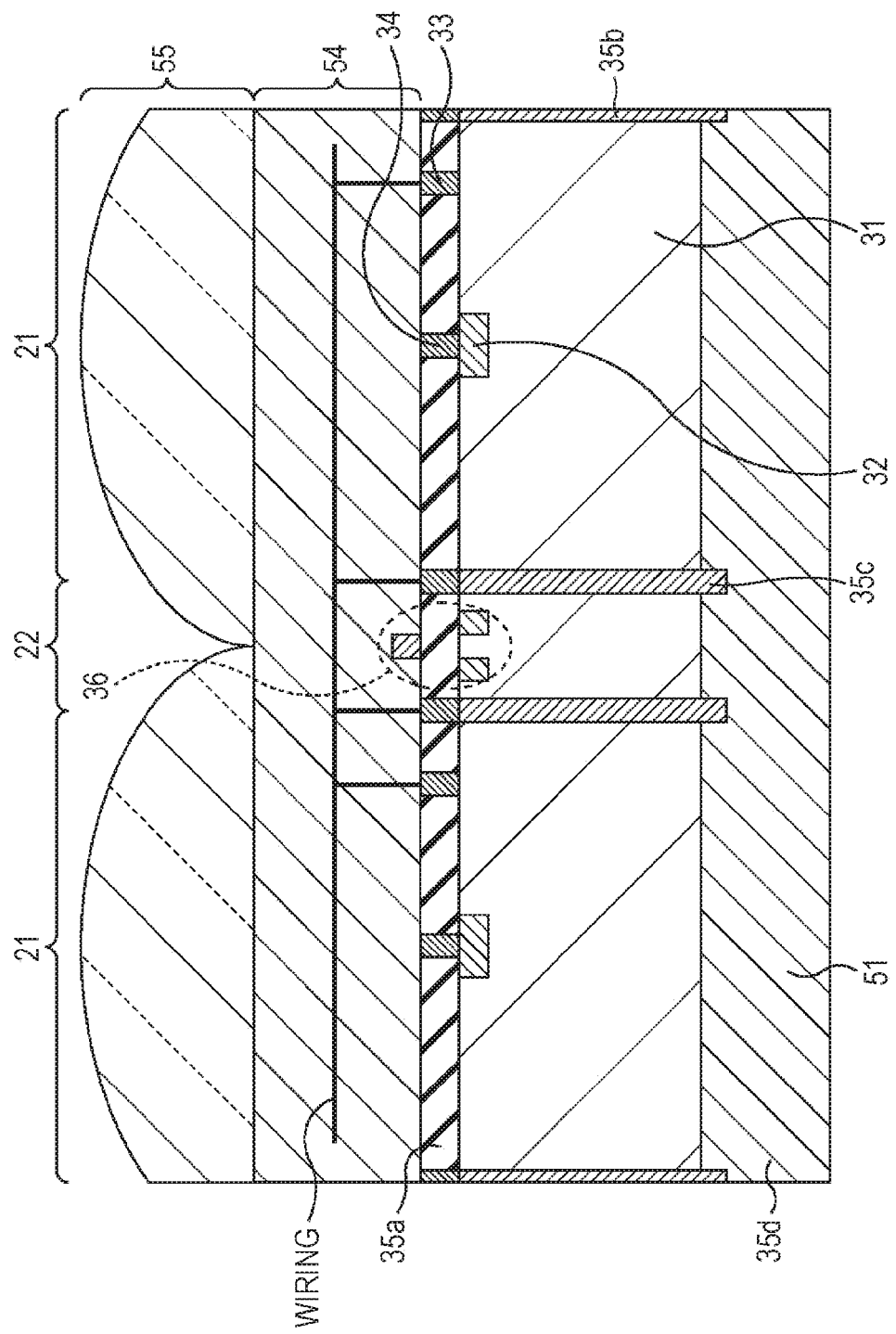
FIG. 12 is a cross-sectional view illustrating a third configuration example when the photovoltaic type pixel of FIG. 6 is applied to a surface irradiation type imaging device.

Next, FIG. 12 is a cross-sectional view of still another configuration example (hereinafter, referred to as a third configuration example) in which the photovoltaic type pixel 10 of the first embodiment is applied to the surface irradiation type imaging device.

In the third configuration example, SiO$_2$ is used in the element isolation region 35a, a metal layer is used in the element isolation regions 35b and 35c, and the N-type substrate 51 of the conductive semiconductor (n-Si) is used as the element isolation region 35d. As a material of the metal layer of the element isolation regions 35b and 35c, it is preferable to use metal that does not degrade a carrier lifetime of the P-type region 31 and the N-type region 32. Furthermore, metal is preferable that forms the Schottky junction with the element isolation region 35d and inhibits the leakage current from flowing from 35b and 35c to 35d. Otherwise, at least the insulating film such as SiO$_2$ is formed on the interface of 35d, 35b and 35c, and the leakage current may be inhibited from flowing from 35b and 35c to 35d. The metal layer is connected to the P-type region 31 and has the same potential, and an electrically neutral region of the P-type region 31 becomes the thermal equilibrium state with the metal layer.

Therefore, since the current flowing between the metal layer and the P-type region 31 becomes zero in the low illumination, it is possible to suppress the decrease of the sensitivity of the low illuminance due to the leakage current.

For the manufacturing method of the third configuration example of FIG. 12, the embedding process of SiO$_2$ as the element isolation regions 35b and 35c in the manufacturing method of the first configuration example of FIG. 10 may be replaced with the embedding process of the metal layer. Furthermore, before embedding the metal, the insulating film such as SiO$_2$ may be formed on the surfaces of 35b and 35c using the technology of the thermal oxidation, the ALD, or the like.

Figure 13:
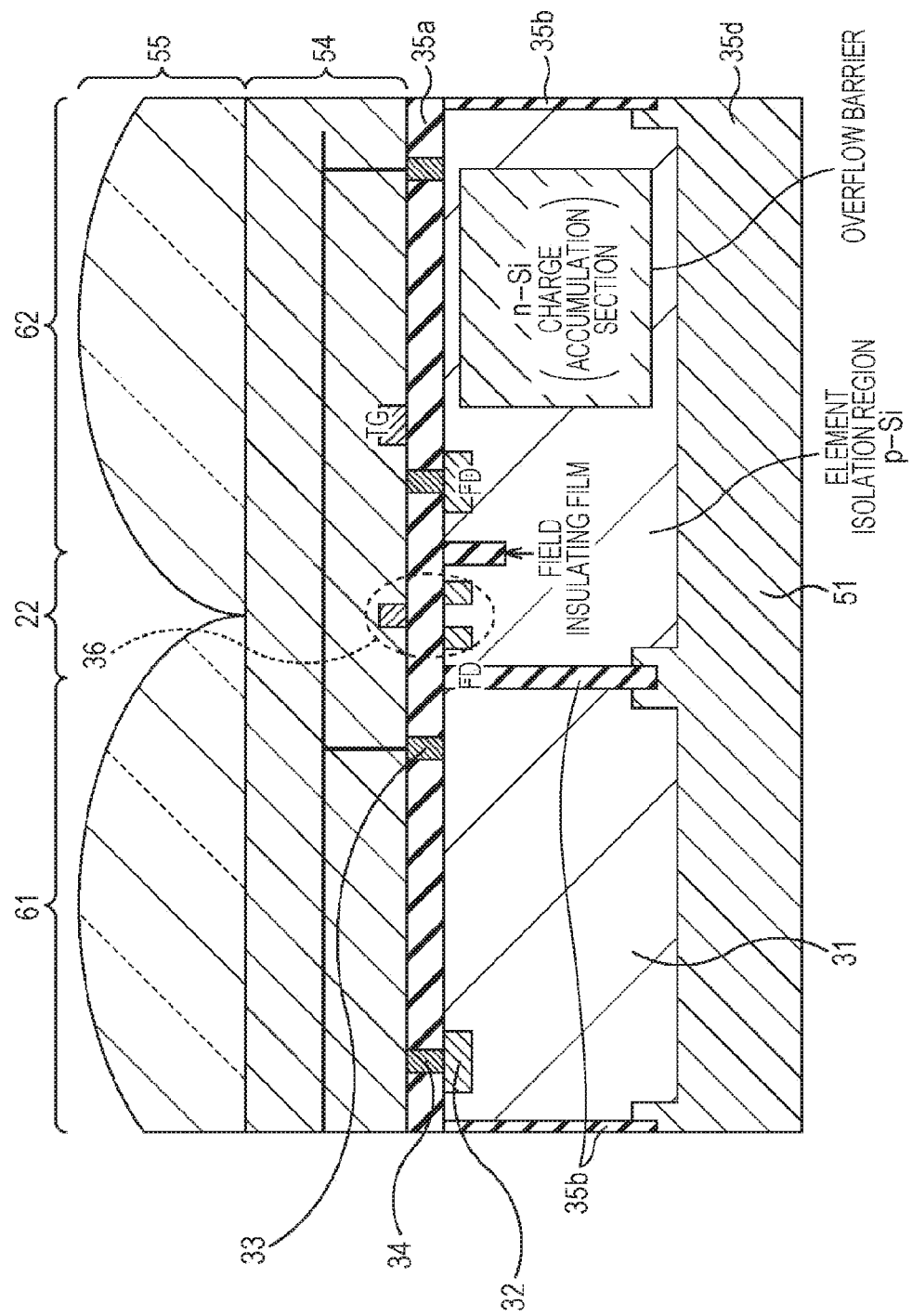
FIG. 13 is a cross-sectional view illustrating a fourth configuration example when the photovoltaic type pixel of FIG. 6 is applied to a surface irradiation type imaging device.

Next, FIG. 13 is a cross-sectional view of still yet another configuration example (hereinafter, referred to as a fourth configuration example) in which the photovoltaic type pixel 10 of the first embodiment is applied to the surface irradiation type imaging device. In the fourth configuration example, a photovoltaic type pixel 61 (corresponding to the photovoltaic type pixel 10) and an accumulation type pixel 62 are disposed in photoelectric conversion regions adjacent to each other across the pixel circuit region 22.

Moreover, the photovoltaic type pixel 61 of FIG. 13 is the same as the first configuration example illustrated in FIG. 10, but may employ the second configuration example illustrated in FIG. 11 or the third configuration example illustrated in FIG. 12. On the other hand, for the portion of the accumulation type pixel 62, it is possible to apply the existing configuration as illustrated in FIG. 13.

As illustrated in the view, a PN junction region of the photovoltaic type pixel 61 is surrounded by the element isolation regions 35a, 35b, 35c, and 35d, but it is not necessary for areas between the following regions to be surrounded by the element isolation regions 35b and 35c:

Between the photoelectric conversion region of the accumulation type pixel 62 and the photoelectric conversion region of the adjacent accumulation type pixel 62;

Between the photoelectric conversion region of the accumulation type pixel 62 and the pixel circuit region 22 of the accumulation type pixel 62;

Between the photoelectric conversion region of the accumulation type pixel 62 and the pixel circuit region of the adjacent photovoltaic type pixel 61.

For the manufacturing method of the fourth configuration example of FIG. 13, the manufacturing process of the first configuration example illustrated in FIG. 10 may be added to the manufacturing method of the existing accumulation type pixel 62.

Figure 14:
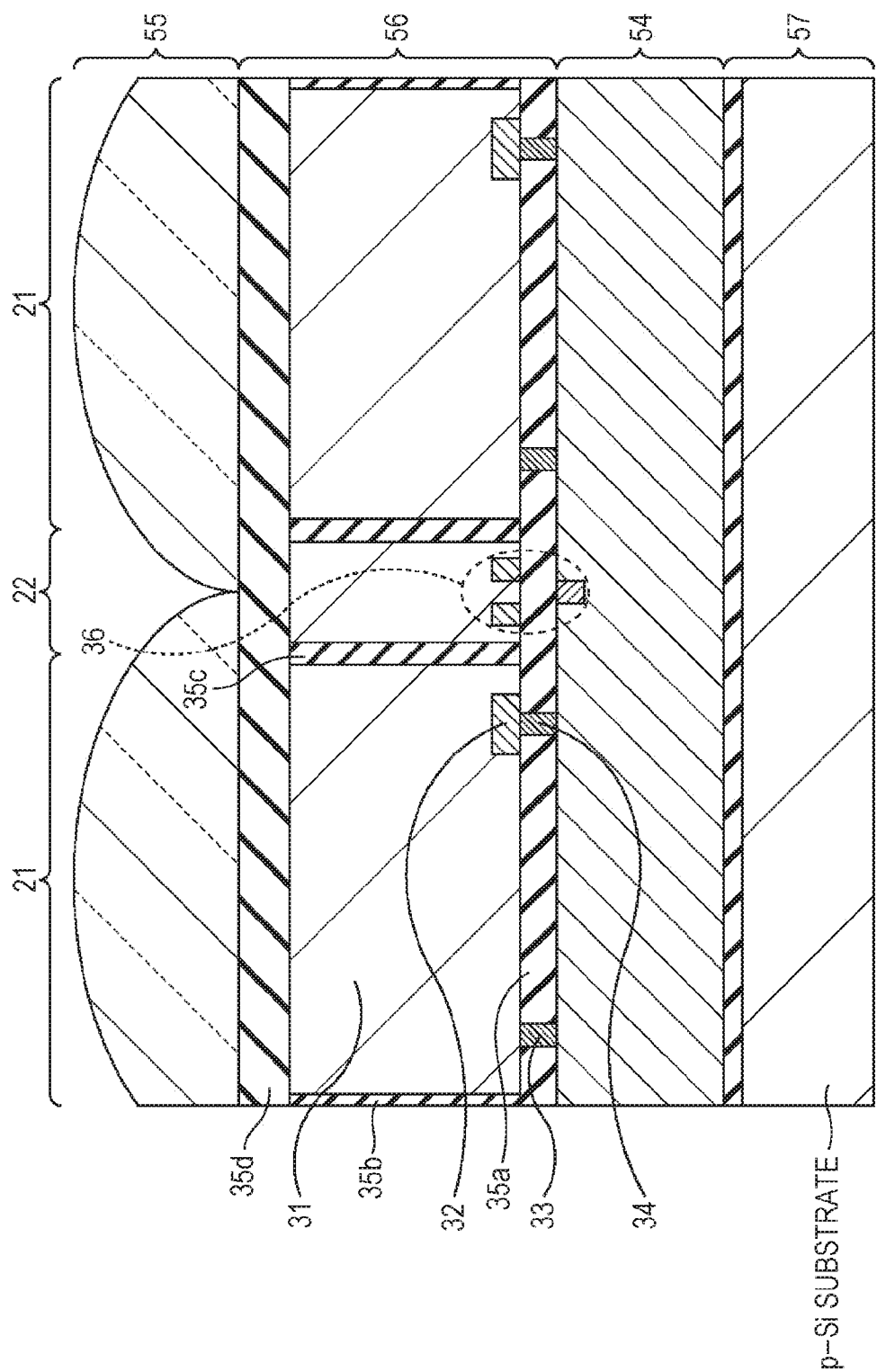
FIG. 14 is a cross-sectional view illustrating a fifth configuration example when the photovoltaic type pixel of FIG. 6 is applied to a back surface irradiation type imaging device.

Next, FIG. 14 is a cross-sectional view of a configuration example (hereinafter, referred to as a fifth configuration example) in which the photovoltaic type pixel 10 of the first embodiment is applied to the back surface irradiation type imaging device.

In the fifth configuration example, the photoelectric conversion region 21 and the pixel circuit region 22 are formed on the same substrate (sensor substrate 56). Each photoelectric conversion region 21 is surrounded by the element isolation regions 35a, 35b, 35c, and 35d, and the element isolation regions 35a to 35d are formed of $SiO_2$.

A manufacturing method of the fifth configuration example will be described. First, a circuit substrate 58 in which a signal processing circuit and the like are formed, and the sensor substrate 56 in which the pixel (photovoltaic type pixel) is formed are attached to each other by the wiring layer 54, and the back surface of the sensor substrate 56 is polished to a predetermined thickness. Next, a region of the sensor substrate 56 that forms the element isolation regions 35b and 35c is etched from the back surface side and $SiO_2$ is embedded, and then the element isolation regions 35b and 35c are formed. Furthermore, a $SiO_2$ oxide film is formed on the back surface of the sensor substrate 56 as the element isolation region 35d, and, finally, the condensing layer 55 is laminated.

Moreover, for the polishing of the sensor substrate 56, for example, it is possible to apply the CMP method. For the etching of the sensor substrate 56, for example, it is possible to apply a reactive ion-etching method. For the embedment of $SiO_2$, it is possible to apply a chemical vapor deposition method. Moreover, metal may be embedded similar to the third configuration example illustrated in FIG. 12, instead of embedding $SiO_2$.

Figure 15:
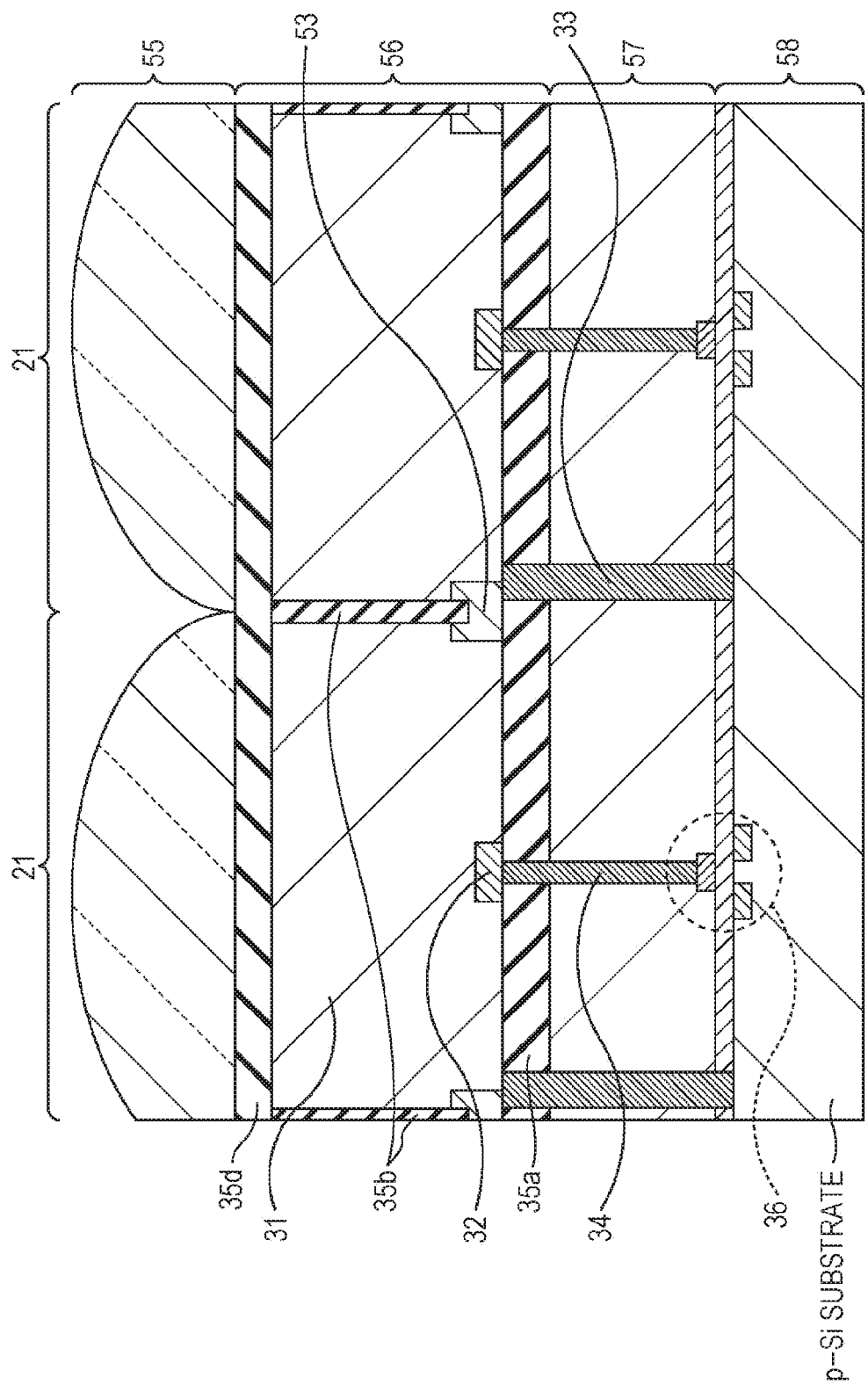
FIG. 15 is a cross-sectional view illustrating a sixth configuration example when the photovoltaic type pixel of FIG. 6 is applied to a back surface irradiation type imaging device.

Next, FIG. 15 is a cross-sectional view of another configuration example (hereinafter, referred to as a sixth configuration example) in which the photovoltaic type pixel 10 of the first embodiment is applied to the back surface irradiation type imaging device.

In the sixth configuration example, the photoelectric conversion region 21 and the pixel circuit region (the MOS Tr. 36 and the like) are formed on different substrates (the sensor substrate 56 and the circuit substrate 58). Each photoelectric conversion region 21 is surrounded by the element isolation regions 35a, 35b, 35c, and 35d, and the element isolation regions 35a and 35d are formed of $SiO_2$, and the element isolation regions 35b and 35c are formed by $SiO_2$ and the N-type region 53.

The N-type region 53 and the P-type region 31 of the sensor substrate 56 are short-circuited by the electrode 33 and the thermal equilibrium state is achieved between both sides. The electrode 33 is also connected to a GND electrode (not illustrated) of the circuit substrate 58. The N-type region 32 generating the photovoltaic power is connected to a gate of the MOS Tr. 36 of the circuit substrate 58 by the electrode 34.

For the manufacturing method of the sixth configuration example, before forming the element isolation regions 35b and 35c with respect to the manufacturing method of the fifth configuration example illustrated in FIG. 14, the N-type region 53 is formed and the etching for the element isolation regions 35b and 35c may be modified so as to stop at a position in which the etching reaches the N-type region 53.

Moreover, in the sixth configuration example, a case where the sensor substrate 56 and the circuit substrate 58 are attached to each other by the wiring layer 54 is illustrated, but surfaces of the sensor substrate 56 and the circuit substrate 58 are bump-connected to each other by using mounting technology and a configuration of a so-called hybrid sensor may be employed.

Figure 16:
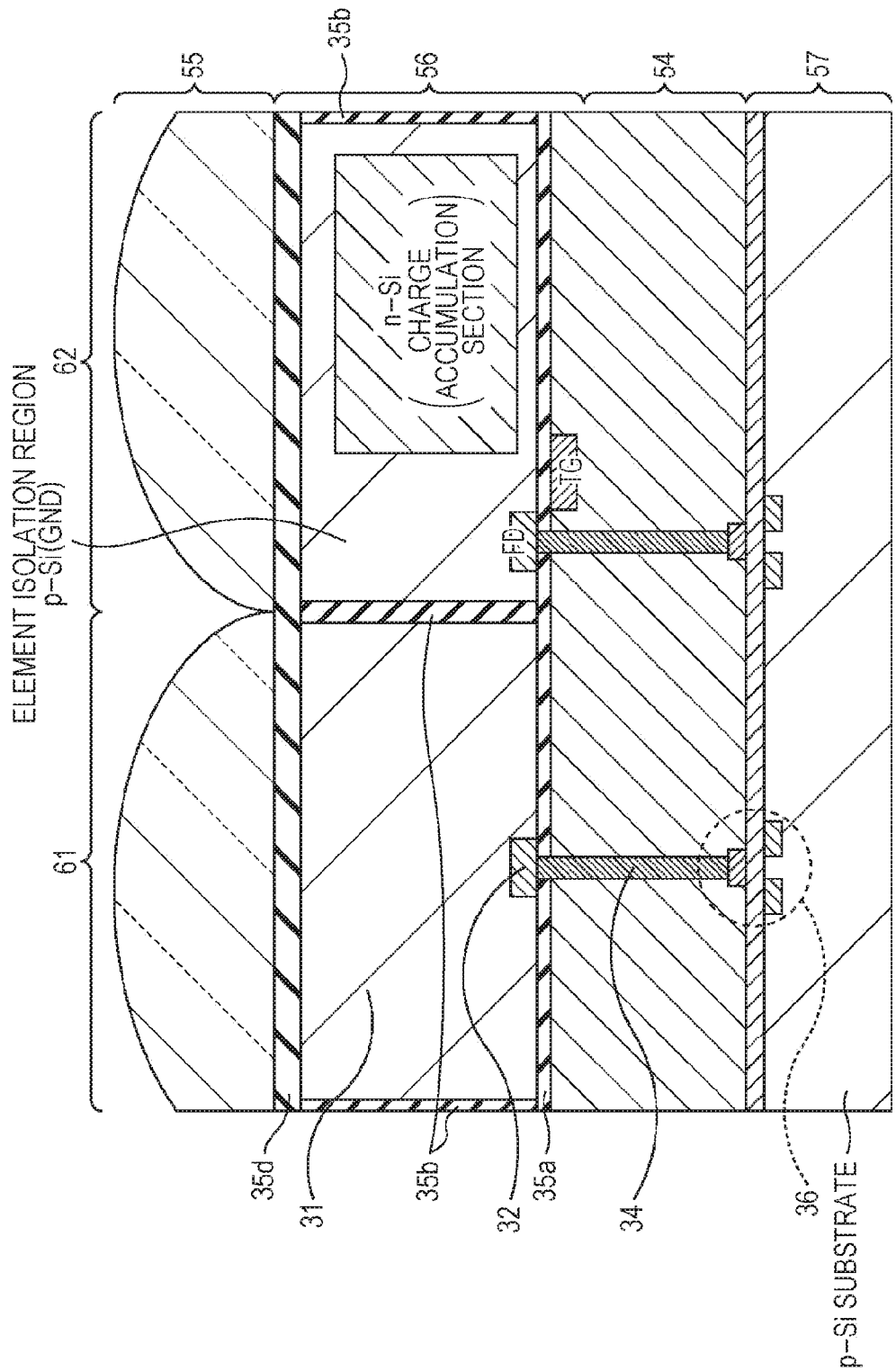
FIG. 16 is a cross-sectional view illustrating a seventh configuration example when the photovoltaic type pixel of FIG. 6 is applied to a back surface irradiation type imaging device.

Next, FIG. 16 is a cross-sectional view of still another configuration example (hereinafter, referred to as a seventh configuration example) in which the photovoltaic type pixel 10 of the first embodiment is applied to the back surface irradiation type imaging device. In the seventh configuration example, the photovoltaic type pixel 61 (corresponding to the photovoltaic type pixel 10) and the accumulation type pixel 62 are disposed in the adjacent photoelectric conversion regions.

Moreover, the photovoltaic type pixel 61 of FIG. 16 is the same as the sixth configuration example illustrated in FIG. 15, but may employ the fifth configuration example illustrated in FIG. 14. On the other hand, for the portion of the accumulation type pixel 62, it is possible to apply the existing configuration as illustrated in FIG. 16. Furthermore, as illustrated in FIG. 15, the electrode applying the potential to the element isolation region of the P-type region 31 and the accumulation type pixel 62 may be provided on the side of the circuit of the sensor substrate 56 or may be provided on the side of the incident surface of the light (neither of which is illustrated).

2. Second Embodiment

Next, a photovoltaic type pixel (hereinafter, referred to as an accumulation type and photovoltaic type pixel) that can also be operated as the accumulation type pixel of the second embodiment will be described.

Figure 17:
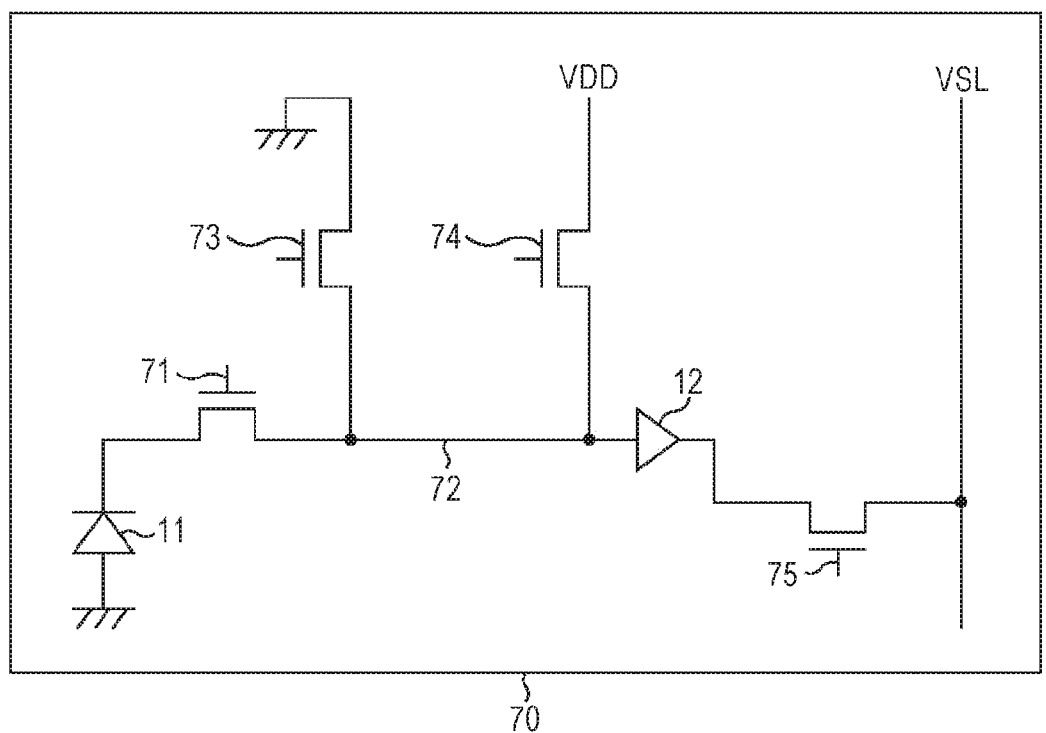
FIG. 17 is a circuit diagram illustrating an equivalent circuit of an accumulation type and photovoltaic type pixel that is a second embodiment of the present disclosure.

FIG. 17 illustrates an equivalent circuit of the accumulation type and photovoltaic type pixel according to the second embodiment. An accumulation type and photovoltaic type pixel 70 is configured of a PN junction diode 11, an amplifier 12, a TG 71, an FD 72, an RST 73, an RST 74, and an Sel 75.

The PN junction diode 11 is configured of the P-type region 31 and the N-type region (charge accumulation region) 32 (all in FIG. 19), and performs the photoelectric conversion depending on the incident light, and accumulates the signal charges generated as a result thereof or generates the photovoltaic power.

The TG 71 transfers the generated signal charges to the FD 72. Furthermore, the TG 71 transfers the generated photovoltaic power to the FD 72 by shorting the N-type region 32 in the FD 72 by a channel formed under the TG 71.

The FD 72 is the N-type region and converts the signal charges into the signal voltage. The RST 73 resets the FD 72 to a GND potential. The RST 74 resets the FD 72 to a VDD potential. The amplifier 12 amplifies the potential of the FD 72. The Sel 75 transfers an output signal of the amplifier 12 to a vertical signal line VSL.

Figure 18:
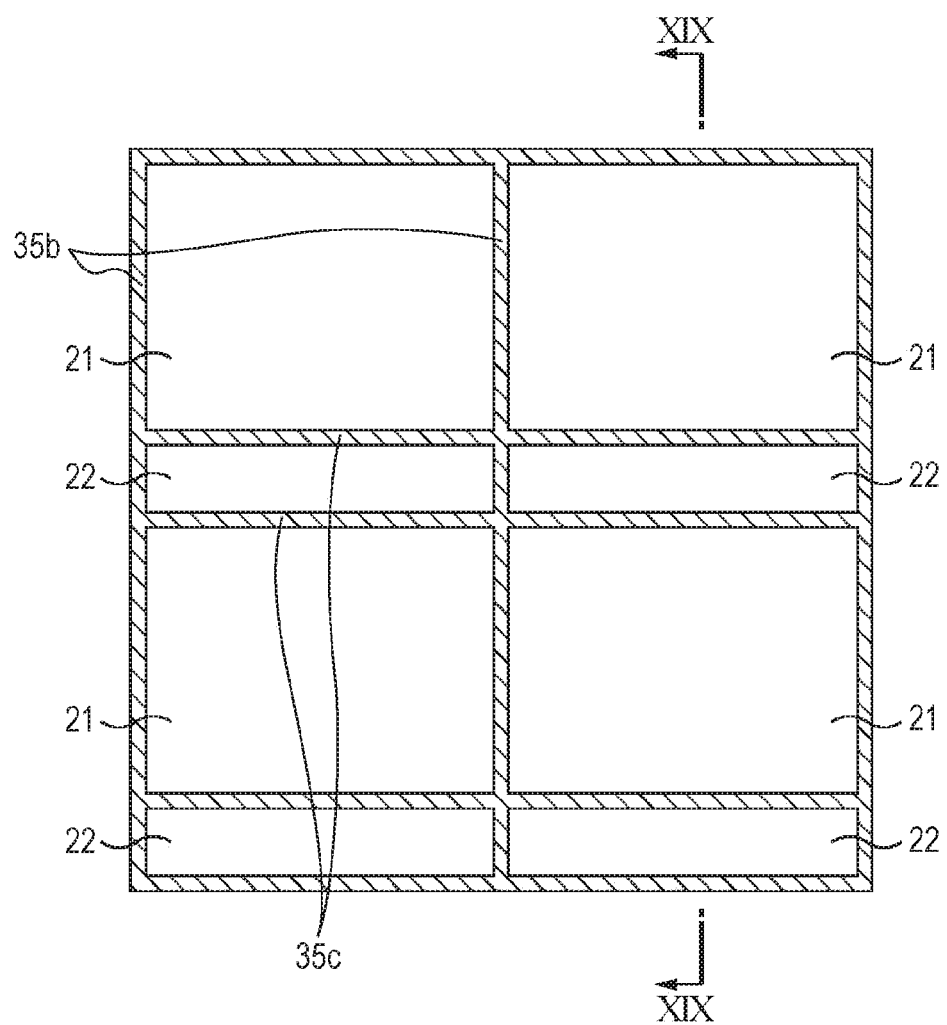
FIG. 18 is a top view of a pixel structure of the accumulation type and photovoltaic type pixel of FIG. 17.

FIG. 18 illustrates an arrangement view of an upper surface of 2×2 pixels of a pixel structure corresponding to the accumulation type and photovoltaic type pixel 70 of which the equivalent circuit is illustrated in FIG. 17. As illustrated in the same view, the accumulation type and photovoltaic type pixel 70 is configured of a photoelectric conversion region 21 and a pixel circuit region 22 which are isolated by an element isolation region 35. The PN junction diode 11, the TG 71, and the FD 72 of FIG. 17 are formed in the photoelectric conversion region 21 and the amplifier 12, the RST 73, the RST 74, the Sel 75 and the like besides thereof are formed in the pixel circuit region 22.

Figure 19:
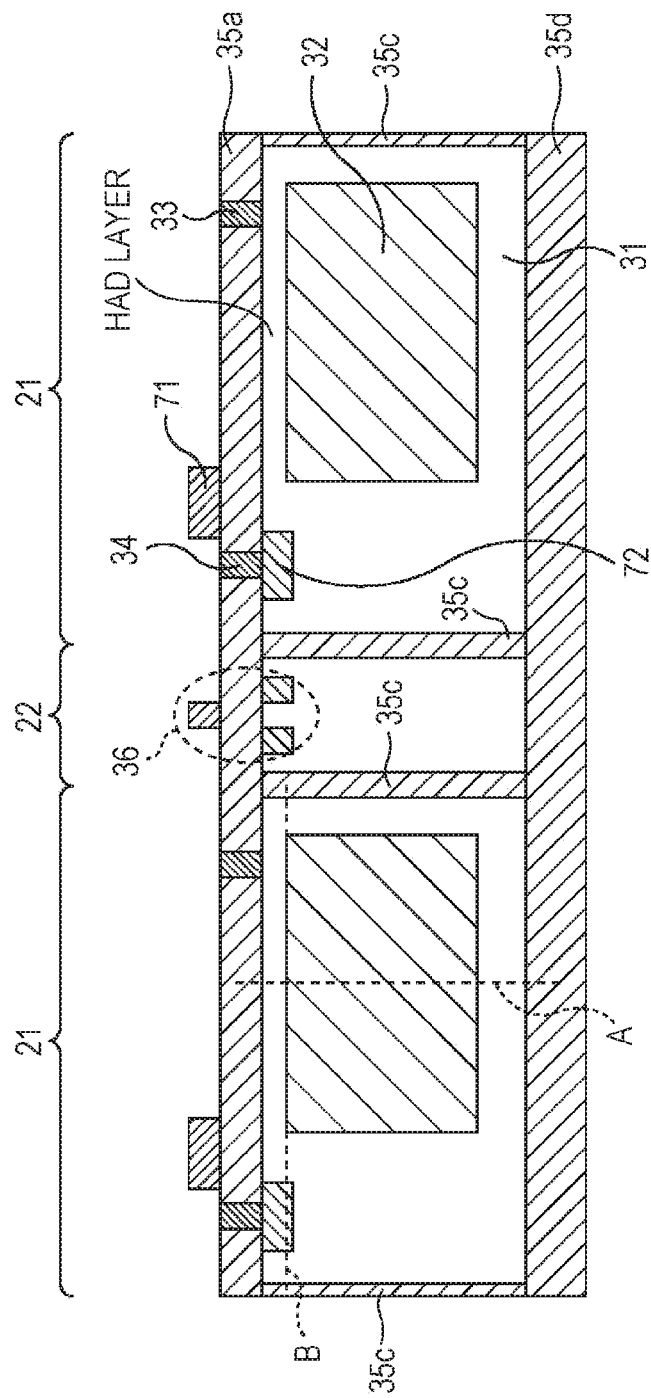
FIG. 19 is a cross-sectional view of a pixel structure corresponding to the accumulation type and photovoltaic type pixel of FIG. 17.

FIG. 19 illustrates a cross section of the pixel structure in line XIX-XIX of FIG. 18. As illustrated in the same view, isolation between the photoelectric conversion region 21 and the pixel circuit region 22 is performed by the element isolation region 35.

As is apparent by comparing FIG. 19 and the cross-sectional views (FIGS. 8 and 9) of the photovoltaic type pixel 10 of the first embodiment, the accumulation type and photovoltaic type pixel 70 is structurally different from the photovoltaic type pixel 10 in that the FD 72 is provided inside thereof surrounded by the element isolation regions 35a, 35b, 35c, and 35d, the electrode (ohmic electrode) 34 is connected to the FD 72, and the TG 71 is provided for controlling the potential barrier between the FD 72 and the N-type region (charge accumulation region) 32.

Figure 20B:
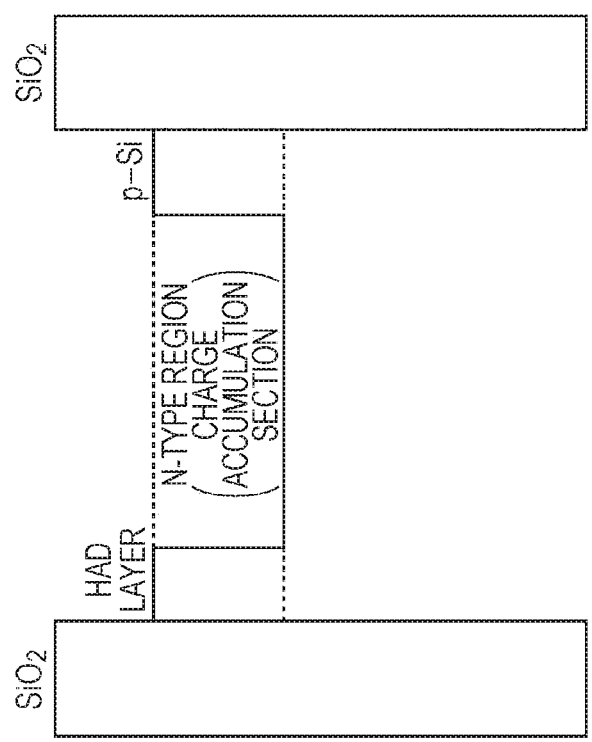
FIGS. 20A and 20B are potential distribution views of the accumulation type and photovoltaic type pixel of FIG. 17.
Figure 20A:
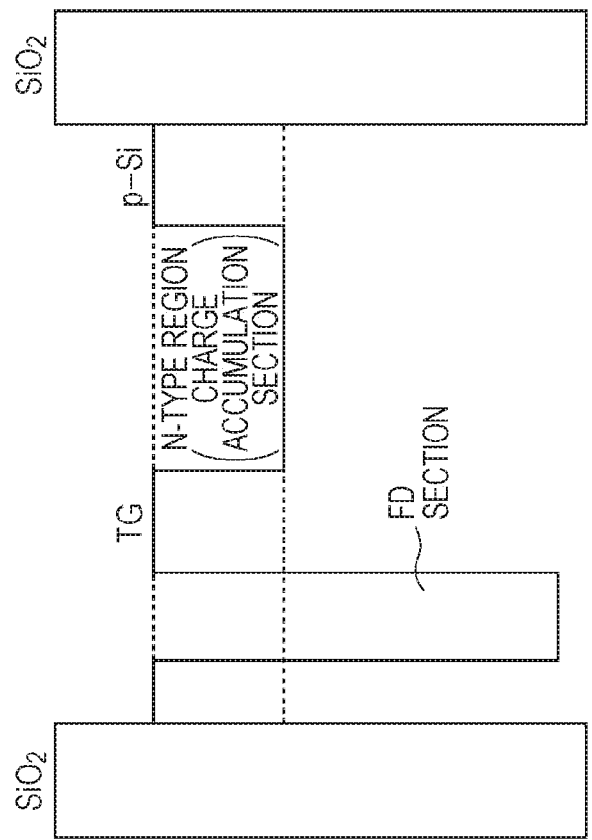

Next, FIGS. 20A and 20B are potential distribution views of the accumulation type and photovoltaic type pixel 70, FIG. 20A corresponds to line A of FIG. 19 and FIG. 20B corresponds to line B of FIG. 19. Moreover, in FIGS. 20A and 20B, it is assumed that all element isolation regions 35 are $SiO_2$. As illustrated in the same view, it is preferable that the height of the potential barrier of the circumference of the N-type region (charge accumulation region) 32 of the accumulation type and photovoltaic type pixel 70 be substantially equal in any direction and be distributed to the height of the potential of a P-type neutral region.

It is possible to operate the accumulation type and photovoltaic type pixel 70 illustrated in FIG. 17 as the accumulation type pixel or the photovoltaic type pixel by the potential distribution.

FIG. 21 illustrates a timing chart when the accumulation type and photovoltaic type pixel 70 is operated as the accumulation type pixel. Specifically, the TG 71 is turned OFF and the PN junction diode 11 is reset by the RST 74, and it is possible to be operated as the accumulation type pixel.

Figure 22:
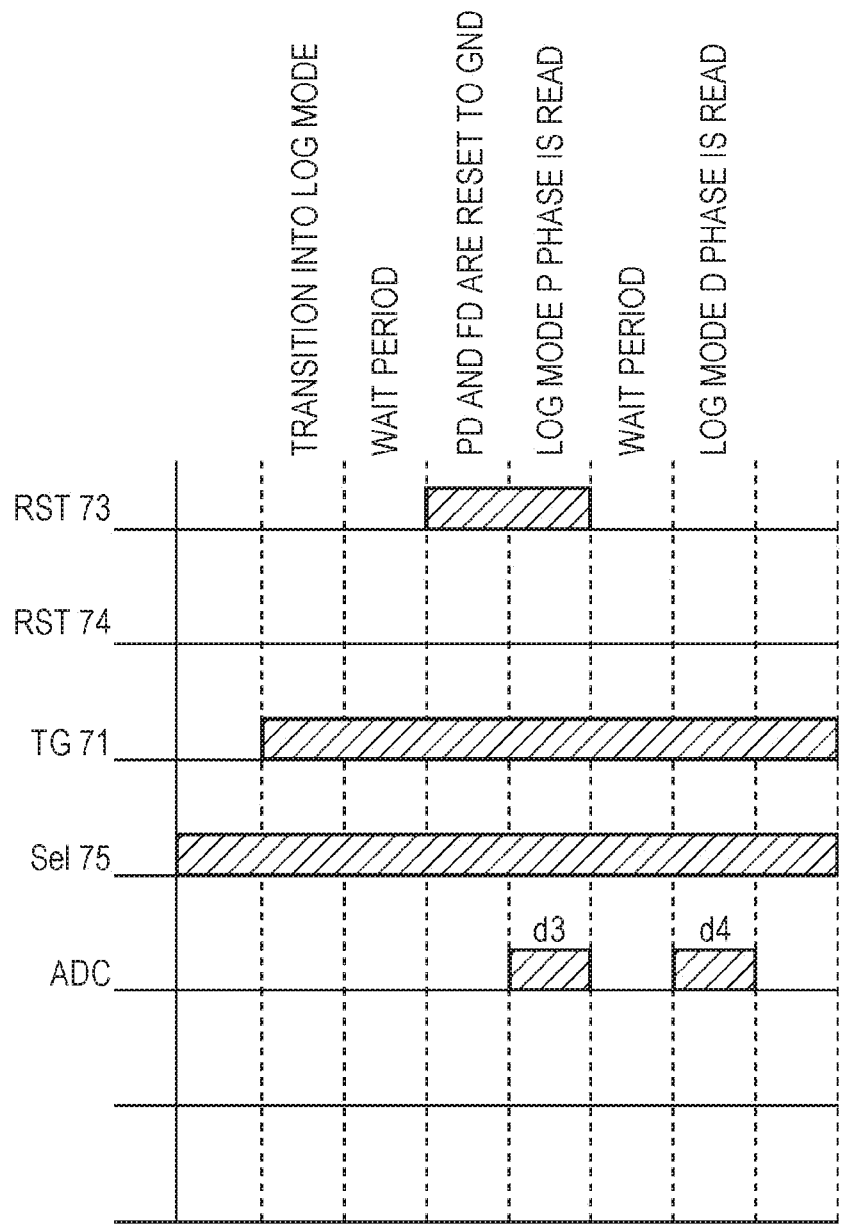
FIG. 22 is a timing chart when the accumulation type and photovoltaic type pixel of FIG. 17 are operated as a photovoltaic type pixel.

FIG. 22 illustrates a timing chart when the accumulation type and photovoltaic type pixel 70 is operated as the photovoltaic type pixel. Specifically, the TG 71 is turned ON and the PN junction diode 11 is reset by the RST 73, and it is possible to be operated as the photovoltaic type pixel.

Moreover, when operating as the accumulation type pixel, since the charges generated in the PN junction diode 11 are confined inside the potential barrier having the same height in any direction, it is possible to generate the same photovoltaic power as when operating as the photovoltaic type pixel.

Furthermore, since the N-type region (charge accumulation region) 32 is surrounded by the P-type region 31 and the potential barrier under the TG 71, and does not come into contact with the interface of Si/$SiO_2$, the dark current can be suppressed similar to the accumulation type pixel of the related art and it is possible to obtain a good S/N even in the low illuminance.

Furthermore, the same pixel may be operated while switching between the accumulation type and the photovoltaic type. When operating the pixel by switching to the photovoltaic type immediately after operating the pixel in the accumulation type, it is possible to shorten a Wait period before reading the D phase by reversing the reading order of the P phase and the D phase of FIG. 22.

Figure 23:
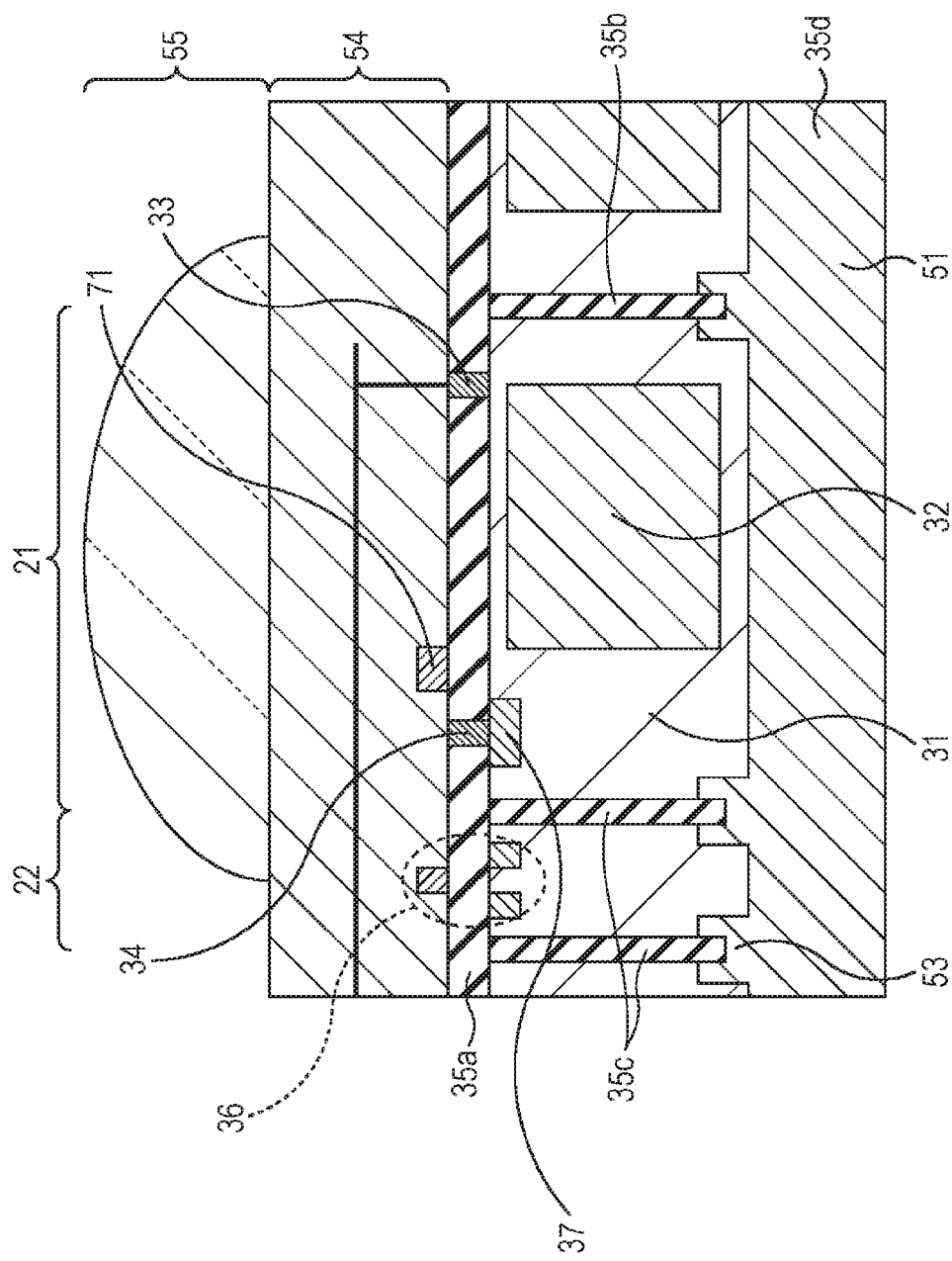
FIG. 23 is a cross-sectional view illustrating an eighth configuration example when the accumulation type and photovoltaic type pixel of FIG. 17 are applied to the surface irradiation type imaging device.

Specific Configuration Example of Accumulation Type and Photovoltaic Type Pixel 70 of Second Embodiment FIG. 23 is a cross-sectional view of a configuration example (hereinafter, referred to as an eighth configuration example) when the accumulation type and photovoltaic type pixel 70 of the second embodiment is applied to the surface irradiation type imaging device.

Moreover, the element isolation regions 35a to 35d of the eighth configuration example use the same material as that of the element isolation regions 35a to 35d of the first configuration example illustrated in FIG. 10, but may be the same configuration as the element isolation regions 35a to 35d of the second configuration example illustrated in FIG. 11 or the third configuration example illustrated in FIG. 12.

A manufacturing method of the eighth configuration example will be described. It is possible to manufacture the eighth configuration example by slightly correcting the manufacturing method of the surface irradiation type and accumulation type pixel (for example, the accumulation type pixel 62 in the fourth configuration example illustrated in FIG. 13) of the related art as described below and by adding a forming process of the element isolation regions 35a to 35d.

Acceptor impurity is introduced into a region (a region between the N-type substrate 51 and the N-type region 32 in the P-type region 31) forming the overflow barrier in the accumulation type pixel of the related art so as to form the P-type neutral region. Therefore, when operating the eighth configuration example as the photovoltaic type pixel, it is possible to generate the same photovoltaic power as that of the photovoltaic type pixel of the first embodiment.

The acceptor impurity is introduced into the P-type region 31 or a film that generates negative fixed charges is embedded inside $SiO_2$ of the element isolation regions 35b and 35c so that hole concentration in the vicinity of the interface of the P-type region 31 and the element isolation regions 35b and 35c is set so as to have a predetermined concentration or more. As the film generating the negative fixed charges, for example, it is possible to use a hafnium oxide film and as a film deposition method, it is possible to use a chemical vapor deposition method, a sputtering method, an atomic layer deposition method, and the like. Therefore, when operating the eighth configuration example as the accumulation type pixel, it is possible to reduce the dark current to the same level as that of the accumulation type pixel of the related art.

Figure 24:
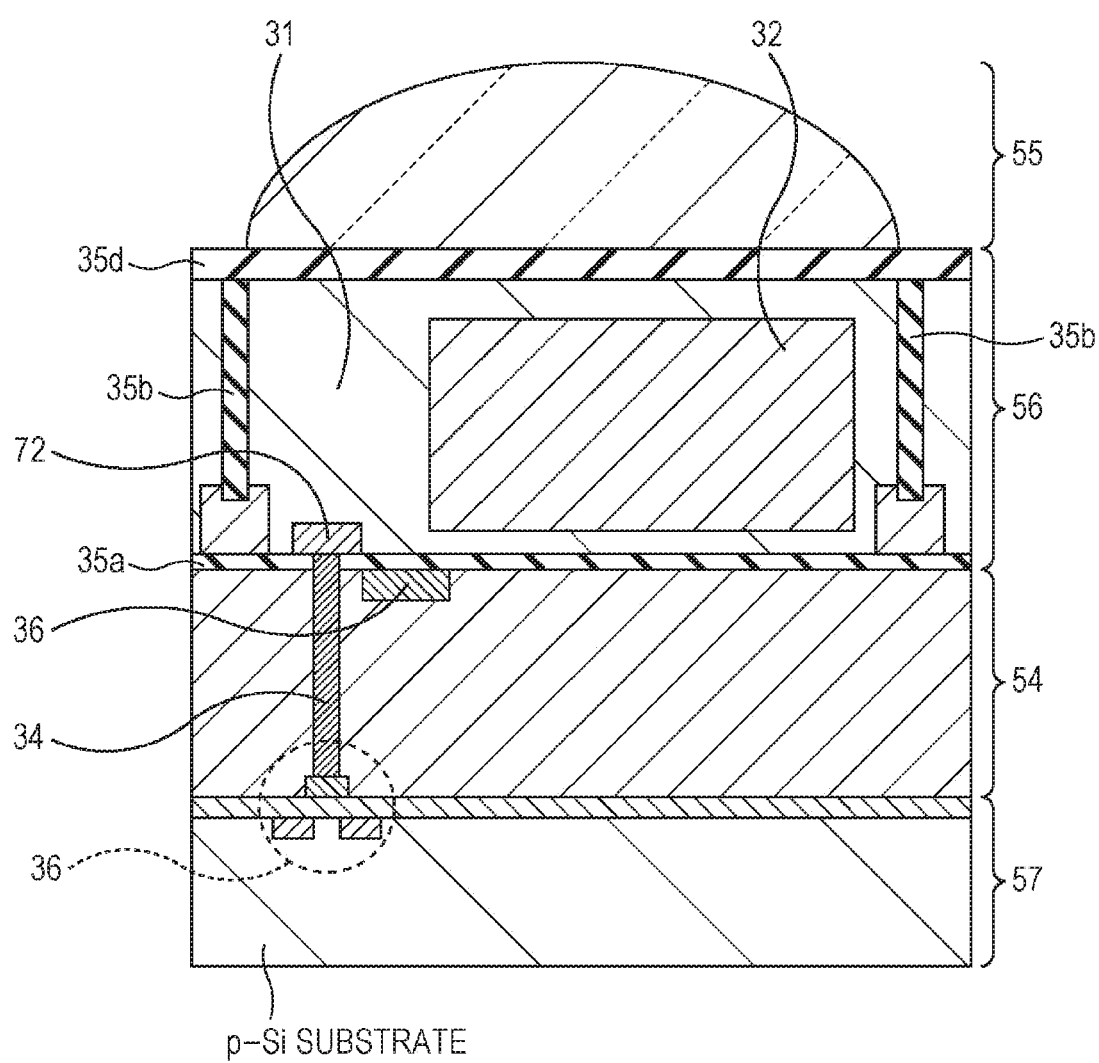
FIG. 24 is a cross-sectional view illustrating a ninth configuration example when the accumulation type and photovoltaic type pixel of FIG. 17 are applied to the back surface irradiation type imaging device.

Next, FIG. 24 is a cross-sectional view of a configuration example (hereinafter, referred to as a ninth configuration example) when the accumulation type and photovoltaic type pixel 70 of the second embodiment is applied to the back surface irradiation type imaging device.

Moreover, the element isolation regions 35a to 35d of the ninth configuration example use the same material as that of the element isolation regions 35a to 35d of the sixth configuration example illustrated in FIG. 15, but may be the same configuration as the element isolation regions 35a to 35d of the seventh configuration example illustrated in FIG. 16.

A manufacturing method of the ninth configuration example will be described. It is possible to manufacture the ninth configuration example by slightly correcting the manufacturing method of the back surface irradiation type and accumulation type pixel of the related art as described below and by adding a forming process of the element isolation regions 35a to 35d.

Acceptor impurity is introduced into the P-type region 31 or a film that generates the negative fixed charges is embedded inside $SiO_2$ of the element isolation regions 35b and 35c so that the hole concentration in the vicinity of the interface of the P-type region 31 and the element isolation regions 35b and 35c is set so as to have a predetermined concentration or more. As the film generating the negative fixed charges, for example, it is possible to use a hafnium oxide film and as a film deposition method, it is possible to use a chemical vapor deposition method, a sputtering method, an atomic layer deposition method and the like. Therefore, when operating the ninth configuration example as the accumulation type pixel, it is possible to reduce the dark current to the same level as that of the accumulation type pixel of the related art.

Figure 25A:
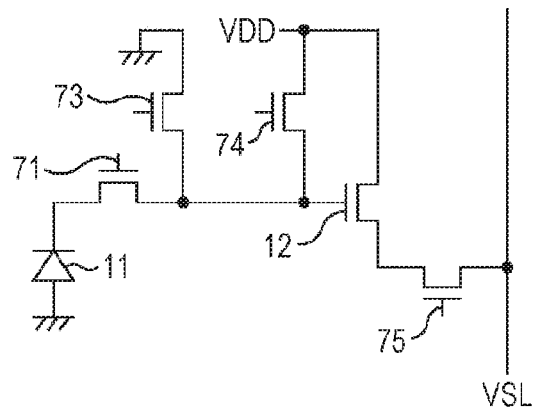
FIGS. 25A to 25C are equivalent circuits illustrating a configuration example capable of employing an amplifier in the accumulation type and photovoltaic type pixel of FIG. 17.
Figure 25B:
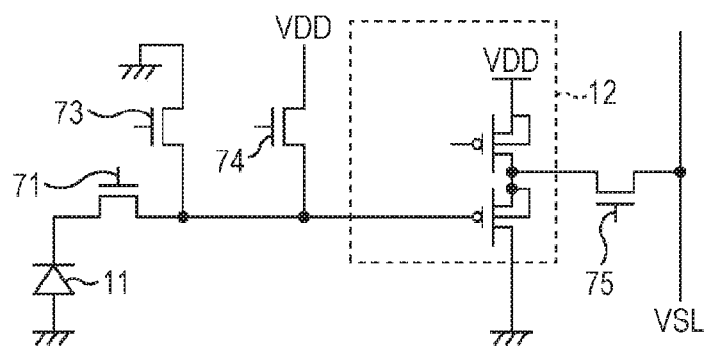
Figure 25C:
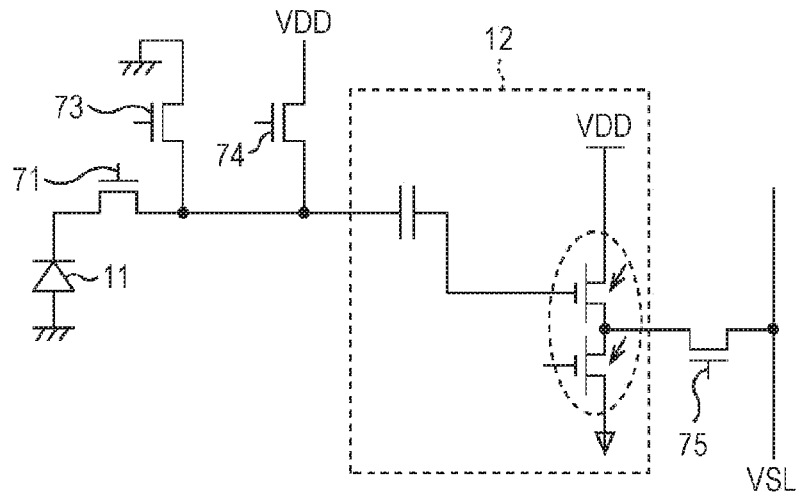

Configuration Example of Amplifier 12 of Equivalent Circuit of Accumulation Type and Photovoltaic Type Pixel 70 of Second Embodiment Next, FIGS. 25A to 25C illustrate three types of configuration examples capable of employing the amplifier 12 in equivalent circuits of the accumulation type and photovoltaic type pixel 70 illustrated in FIG. 17. Moreover, in a case of FIG. 25A or 25B, a signal voltage range is changed depending on whether the accumulation type and photovoltaic type pixel 70 is operated as the accumulation type pixel or operated as the photovoltaic type pixel. Thus, a back gate voltage or the like is changed depending on whether to operate in either mode. Therefore, a threshold voltage of the Amp Tr. (the amplifier 12) is adjusted or a level shifter is inserted between the TG 71 and the Amp Tr. (the amplifier 12).

Output Voltage Characteristics of PN Junction Diode 11

Figure 26:
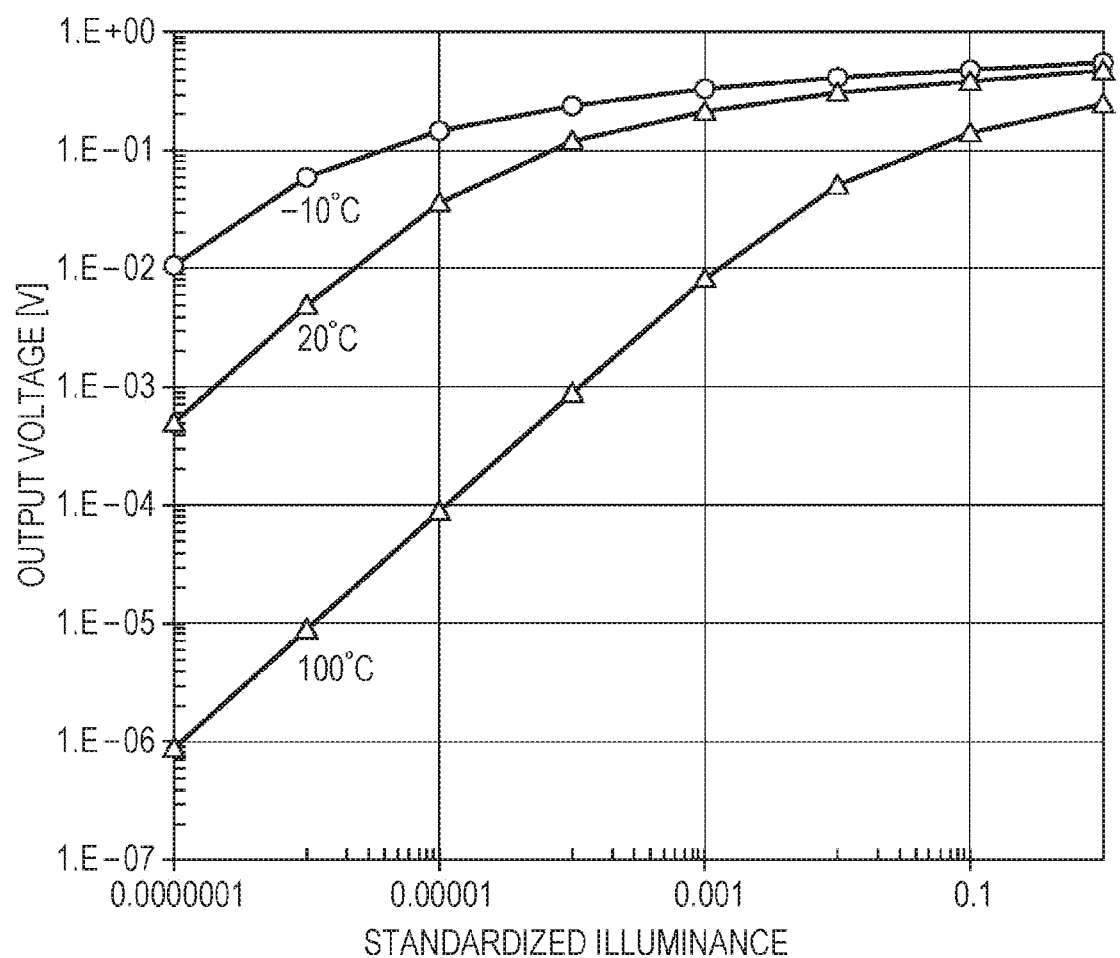
FIG. 26 is a view illustrating output voltage characteristics of a PN junction diode.

Next, FIG. 26 illustrates simulation results of the output voltage of the PN junction diode 11 corresponding to a case where the voltage of the N-type substrate 51 is changed in the first configuration example illustrated in FIG. 10.

As illustrated in the same view, it is understood that the output voltage of the PN junction diode 11 is remarkably changed by the temperature.

Output Voltage Characteristics of FD 37

Figure 27:
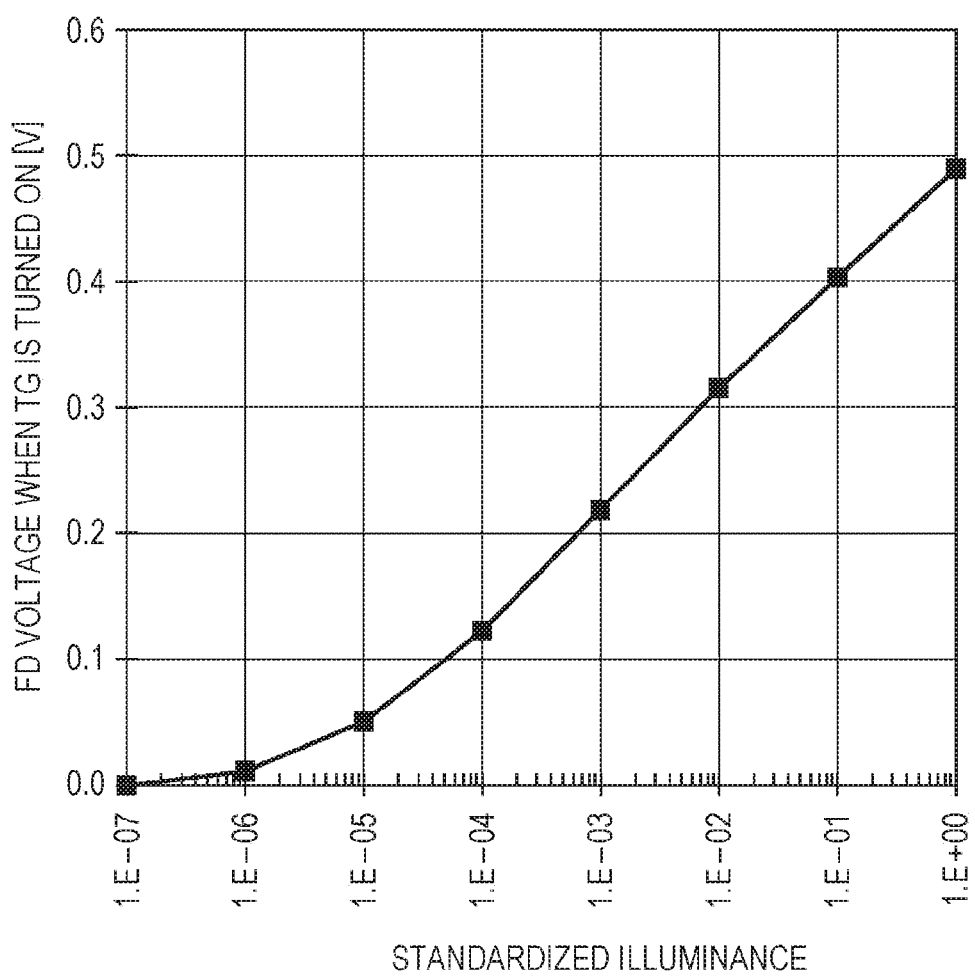
FIG. 27 is a view illustrating simulation results of an output voltage of a FD.

Next, FIG. 27 illustrates simulation results of the output voltage of the FD 72 corresponding to the irradiation light in a state where the TG 71 is turned ON in the eighth configuration example illustrated in FIG. 23. As illustrated in the same view, it is understood that the output voltage of the FD 72 logarithmically increases with respect to the illuminance. That is, it is understood that the eighth configuration example is also operated as the photovoltaic type pixel.

Calibration of Output Value of Photovoltaic Type Pixel

Figure 28:
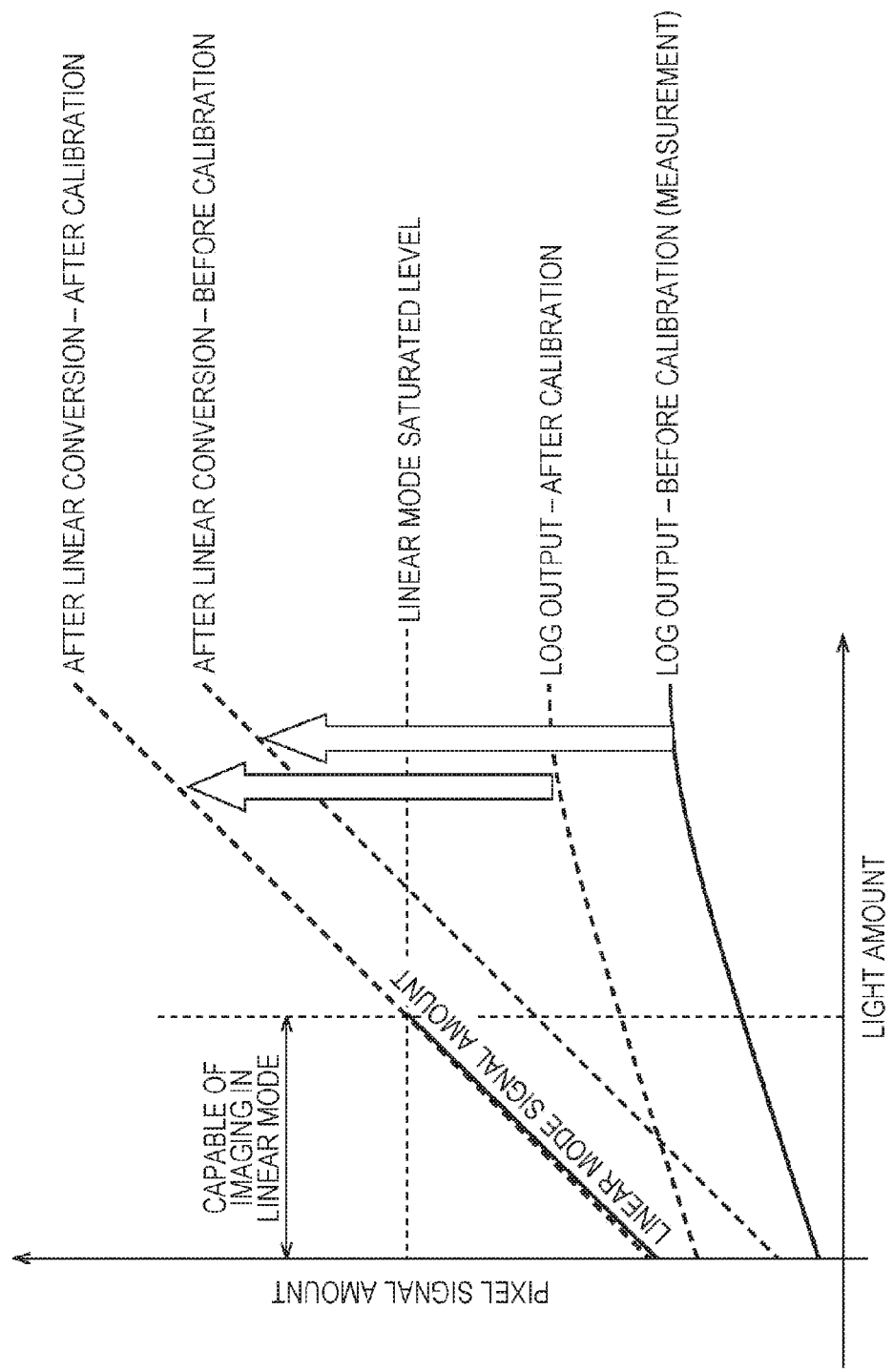
FIG. 28 is a view illustrating an outline of a calibration method of an output value of the photovoltaic type pixel.

FIG. 28 illustrates an outline of a calibration method of an output value of the photovoltaic type pixel by using the output value of the accumulation type pixel of the same pixel or the adjacent pixel.

First, in the same pixel in which the light amount is not saturated, a linear output value and a log output value are obtained. Next, the log output value is converted into the linear value and a calibration coefficient is determined so that the linear value after conversion matches the linear output value. Finally, it is possible to obtain the log output value after calibration by applying the determined calibration coefficient to the log output value of the adjacent pixel that is saturated.

As described above, it is possible to obtain the output value that is continuous to the output value of the accumulation type pixel by calibrating the log output value even when the output value of the photovoltaic type pixel is changed by the temperature. Thus, it is possible to suppress steps when synthesizing the image when operating as the accumulation type pixel and the image when operating as the photovoltaic type pixel.

OVERVIEW

As described above, according to the first and second embodiments, it is possible to block the diffusion current by providing the element isolation region and then it is possible to suppress the forward current of PN junction diode from reaching the adjacent pixel.

Therefore, the blooming is suppressed in the vicinity of the photovoltaic type pixel and, in the first embodiment, it is possible to dispose the photovoltaic type pixel and the accumulation type pixel adjacent to each other without degrading the image quality or the sensitivity.

Furthermore, for example, it is possible to obtain the linear output image and the logarithmic output image in the same imaging device by disposing the photovoltaic type pixel and the accumulation type pixel adjacent to each other without using an optical system that is large scale and expensive such as using a half mirror.

Then, it is possible to obtain the image in a wide luminance range with less noise by obtaining the linear output image and the logarithmic output image in the same imaging device without underexposing a low luminance portion or overexposing a high luminance portion of the object.

Furthermore, according to the second embodiment, since the same pixel can be operated as the photovoltaic type pixel and the accumulation type pixel without increasing the dark current, it is possible to synchronize the image by using the linear output value in the low luminance portion and using the log output value in the high luminance portion of the object. Therefore, it is possible to obtain the linear output image and the log output image without sacrificing the resolution.

Furthermore, when calibrating the log output value by using the linear output value, it is possible to cancel the change in the log output value caused by the temperature. Thus, it is possible to reduce the steps in the interface between the linear output image and the log output image.

Moreover, the first and second embodiments described above can be applied to any electronic apparatus having an imaging function in addition to the imaging apparatus represented by a digital camera.

Furthermore, embodiments of the present disclosure are not limited to the embodiments described above and various modifications are possible without departing from the scope of the present disclosure.

The present disclosure can take the following configurations.

(1) An imaging device including: a photoelectric conversion region that generates photovoltaic power for each pixel depending on irradiation light; and a first element isolation region that is provided between adjacent photoelectric conversion regions in a state of surrounding the photoelectric conversion region.

(2) The imaging device according to (1), further including: a second element isolation region that is provided between the photoelectric conversion region and a pixel circuit region.

(3) The imaging device according to (2), in which the first and second element isolation regions are configured of a material that blocks a diffusion current.

(4) The imaging device according to any one of (1) to (3), in which a PN junction diode is formed in the photoelectric conversion region as a photo-sensor.

(5) The imaging device according to any one of (1) to (4), in which a transfer gate and floating diffusion are further formed in the photoelectric conversion region.

(6) The imaging device according to any one of (1) to (5), in which a photovoltaic type pixel and an accumulation type pixel are formed in the adjacent photoelectric conversion regions.

(7) An electronic apparatus equipped with an imaging device, in which the imaging device includes: a photoelectric conversion region that generates photovoltaic power for each pixel depending on irradiation light; and a first element isolation region that is provided between adjacent photoelectric conversion regions in a state of surrounding the photoelectric conversion region.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a plurality of photoelectric conversion regions that each generate photovoltaic power for a corresponding pixel of the imaging device depending on irradiation light; and
   a first element isolation region that is provided between adjacent first and second photoelectric conversion regions included in the plurality of photoelectric conversion regions, wherein the first element isolation region surrounds at least one of the first and second photoelectric conversion regions, and wherein a photovoltaic type pixel and an accumulation type pixel are formed in the adjacent photoelectric conversion regions.

2. The imaging device according to claim 1, further comprising:
   a second element isolation region that is provided between at least one of the photoelectric conversion regions and a pixel circuit region.

3. The imaging device according to claim 2, wherein the first and second element isolation regions are configured of a material that blocks a diffusion current.

4. The imaging device according to claim 2, wherein a PN junction diode is formed in at least some of the photoelectric conversion regions as a photo-sensor.

5. The imaging device according to claim 4, wherein a transfer gate and a floating diffusion are further formed in at least some of the photoelectric conversion regions.

6. An imaging device comprising:
   a photoelectric conversion region that generates photovoltaic power for each pixel depending on irradiation light, wherein a PN junction diode is formed in the photoelectric conversion region as a photo-sensor, and wherein a transfer gate and a floating diffusion are further formed in the photoelectric conversion region;
   a first element isolation region that is provided between adjacent first and second photoelectric conversion regions, wherein the first element isolation region surrounds at least one of the first and second photoelectric conversion regions, wherein a photovoltaic type pixel and an accumulation type pixel are formed in the adjacent photoelectric conversion regions; and
   a second element isolation region that is provided between the photoelectric conversion region and a pixel circuit region.

7. An electronic apparatus equipped with an imaging device, wherein the imaging device includes:
   a photoelectric conversion region that generates photovoltaic power for each pixel depending on irradiation light, wherein a PN junction diode is formed in the photoelectric conversion region as a photo-sensor, and wherein a transfer gate and a floating diffusion are further formed in the photoelectric conversion region;
   a first element isolation region that is provided between adjacent first and second photoelectric conversion regions, wherein the first element isolation region surrounds at least one of the first and second photoelectric conversion-regions, wherein a photovoltaic type pixel and an accumulation type pixel are formed in the adjacent photoelectric conversion regions; and
   a second element isolation region that is provided between the photoelectric conversion region and a pixel circuit region.

8. The electronic apparatus equipped with an imaging device of claim 7, wherein the first and second element isolation regions are configured of a material that blocks a diffusion current.

* * * * *